United States Patent
Sato et al.

(10) Patent No.: US 8,963,066 B2
(45) Date of Patent: Feb. 24, 2015

(54) SOLID-STATE IMAGING DEVICE, MANUFACTURING METHOD THEREOF, AND ELECTRONIC DEVICE HAVING A PIXEL SEPARATING SECTION CONFIGURED TO SEPARATE CHARGE ACCUMULATING REGIONS OF ADJACENT PIXELS

(75) Inventors: Naoyuki Sato, Kanagawa (JP); Yuki Miyanami, Kanagawa (JP)

(73) Assignee: Sony Corporation (JP)

( * ) Notice: Subject to any disclaimer, the term of this patent is extended or adjusted under 35 U.S.C. 154(b) by 282 days.

(21) Appl. No.: 13/533,466

(22) Filed: Jun. 26, 2012

(65) Prior Publication Data

US 2013/0009039 A1  Jan. 10, 2013

(30) Foreign Application Priority Data

Jul. 5, 2011 (JP) ................................ 2011-148884

(51) Int. Cl.
*H01L 27/146* (2006.01)

(52) U.S. Cl.
CPC ...... *H01L 27/1463* (2013.01); *H01L 27/14623* (2013.01); *H01L 27/1464* (2013.01); *H01L 27/14692* (2013.01); *H01L 27/14621* (2013.01); *H01L 27/14627* (2013.01); *H01L 27/14641* (2013.01); *H01L 27/14689* (2013.01)
USPC ....................................... 250/208.1; 250/239

(58) Field of Classification Search
CPC .............. G01J 1/44; H04N 5/335; H04N 3/14
USPC ........................ 250/208.1, 214.1, 214 R, 239;
257/290–292, 440, 435, E27.13,
257/E31.122; 438/70
See application file for complete search history.

(56) References Cited

U.S. PATENT DOCUMENTS

2011/0279727 A1 * 11/2011 Kusaka .......................... 348/340

FOREIGN PATENT DOCUMENTS

JP   2006-287117   10/2006

* cited by examiner

*Primary Examiner* — Georgia Y Epps
*Assistant Examiner* — Carolynn A Moore
(74) *Attorney, Agent, or Firm* — Sheridan Ross P.C.

(57) ABSTRACT

Disclosed herein is a solid-state imaging device including: a photoelectric conversion section configured to have a charge accumulating region of a first conductivity type formed in a semiconductor layer; a pixel having the photoelectric conversion section and a pixel transistor; a pixel region in which a plurality of the pixels are arranged; an epitaxially grown semiconductor layer of the first conductivity type formed on an inner wall part of a trench disposed in the semiconductor layer at least between adjacent ones of the pixels within the pixel region; and a pixel separating section configured to separate the charge accumulating regions of the adjacent ones of the pixels from each other, the pixel separating section being formed on the inside of the semiconductor layer of the first conductivity type.

9 Claims, 15 Drawing Sheets

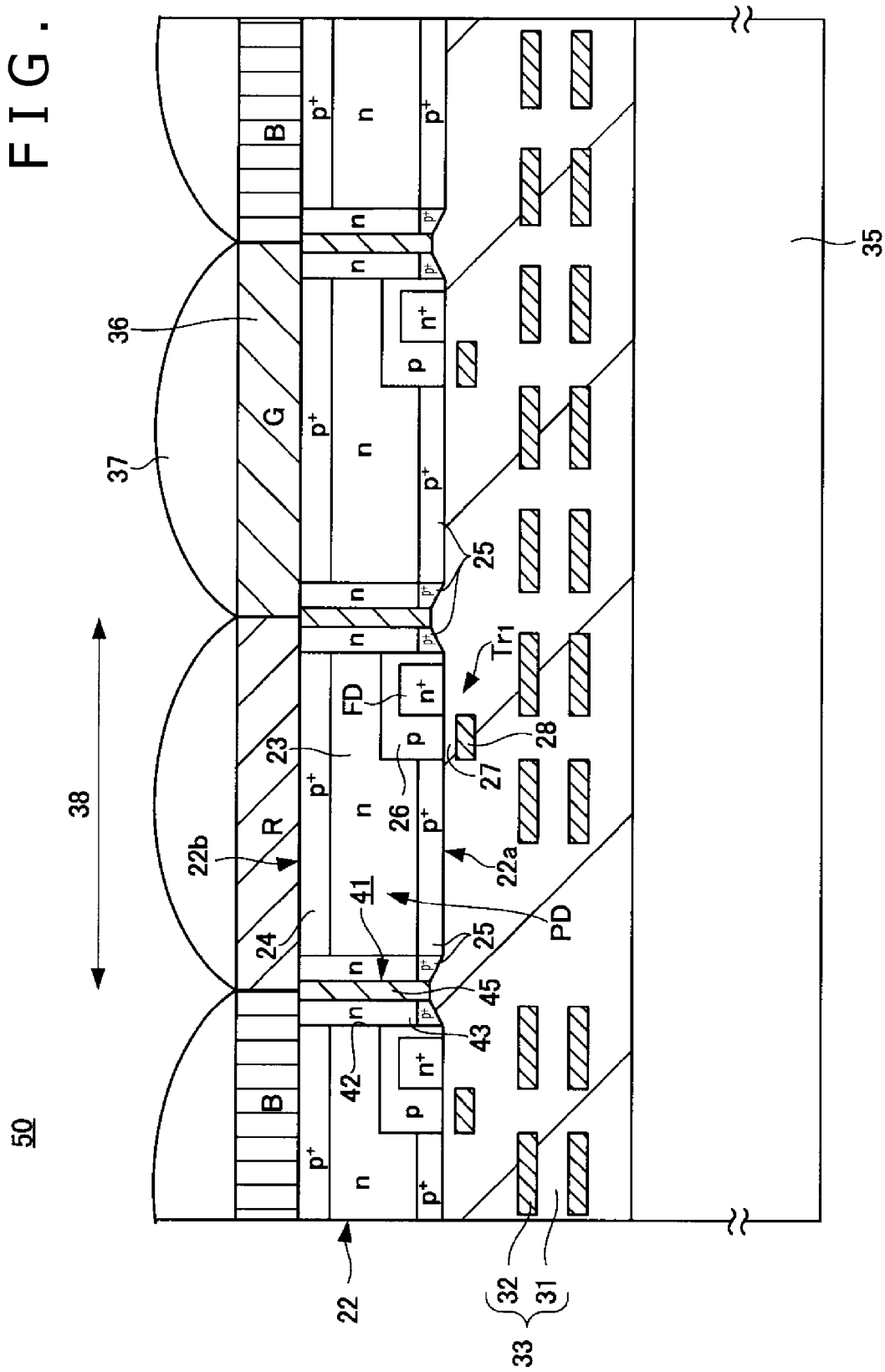

SOLID-STATE IMAGING DEVICE, MANUFACTURING METHOD THEREOF, AND ELECTRONIC DEVICE HAVING A PIXEL SEPARATING SECTION CONFIGURED TO SEPARATE CHARGE ACCUMULATING REGIONS OF ADJACENT PIXELS

BACKGROUND

The present disclosure relates to a solid-state imaging device and a manufacturing method thereof, and is suitable for application to CMOS (complementary metal oxide semiconductor) image sensors and the like. The present disclosure also relates to an electronic device including a solid-state imaging device.

CMOS image sensors (CMOS solid-state imaging devices) have recently been incorporated into electronic devices such as portable telephones, digital cameras, camcorders, and the like, and have been reduced in size and increased in the number of pixels due to cost reductions.

In a CMOS image sensor, generally, as shown in FIG. 10A, adjacent pixels are separated from each other by forming a p-type semiconductor region 103 implanted with a p-type impurity such as boron when forming n-type photodiodes (hereinafter referred to as PDs) 102, for example.

In addition, as shown in FIG. 10B, pixels are physically separated from each other by forming a trench 104 in a semiconductor layer and thereafter burying a p-type epitaxially grown layer or an insulating layer, which is not shown in the figure, within the trench 104 (see Japanese Patent Laid-Open No. 2006-287117, for example).

Incidentally, a reference numeral 101 in FIG. 10A and FIG. 10B denotes a foundation layer (a semiconductor layer, a semiconductor substrate, or another layer or substrate) for the PDs 102.

SUMMARY

For a further size reduction and a further increase in the number of pixels in a solid-state imaging device, it is necessary to reduce the width of a pixel separating section between PDs, and increase the area of the PDs.

However, in a method for separation by impurity implantation performed in a present situation, a lithography limit for the width of the pixel separating section is about 0.3 μm (a resist fall occurs when the limit is exceeded), and there is a tendency to make further miniaturization of the pixel separating section difficult.

In addition, in the technique of physical separation by trench formation, an aspect ratio of the trench is increased as element miniaturization progresses further.

Thus, a process margin in a process of working or the like, such as a margin for in-plane variation, for example, is expected to become insufficient.

Accordingly, it is desirable to provide a solid-state imaging device and a manufacturing method thereof that make it possible to reduce the width of a pixel separating section and increase the area of a photoelectric conversion section. It is also desirable to provide an electronic device including a solid-state imaging device.

A solid-state imaging device according to an embodiment of the present disclosure includes: a photoelectric conversion section configured to have a charge accumulating region of a first conductivity type formed in a semiconductor layer; a pixel including the photoelectric conversion section and a pixel transistor; and a pixel region in which a plurality of pixels are arranged.

The solid-state imaging device also includes an epitaxially grown semiconductor layer of the first conductivity type formed on an inner wall part of a trench disposed in the semiconductor layer at least between adjacent ones of the pixels within the pixel region.

The solid-state imaging device further includes a pixel separating section configured to separate charge accumulating regions of adjacent ones of the pixels from each other, the pixel separating section being formed on the inside of the semiconductor layer of the first conductivity type.

A manufacturing method of a solid-state imaging device according to another embodiment of the present disclosure is a manufacturing method of a solid-state imaging device having a pixel region in which a plurality of pixels including a photoelectric conversion section having a charge accumulating region of a first conductivity type and a pixel transistor are arranged.

The method includes: forming a region of the first conductivity type by implanting an impurity of the first conductivity type into a semiconductor layer; and forming a trench in the region of the first conductivity type at least between adjacent ones of the pixels.

The method also includes: forming a semiconductor layer of the first conductivity type by epitaxial growth on an inner wall part of the trench; and forming a pixel separating section separating charge accumulating regions of adjacent ones of the pixels from each other on the inside of the semiconductor layer of the first conductivity type.

The method further includes: forming the pixels including the photoelectric conversion section and the pixel transistor, with the region of the first conductivity type in a part adjacent to the trench as the charge accumulating region.

An electronic device according to a further embodiment of the present disclosure includes: a solid-state imaging device; an optical system configured to guide incident light to a photoelectric conversion section of the solid-state imaging device; and a signal processing circuit configured to process an output signal of the solid-state imaging device. The solid-state imaging device has the constitution of the solid-state imaging device according to the above-described embodiment of the present disclosure.

According to the constitution of the solid-state imaging device according to the above-described embodiment of the present disclosure, the epitaxially grown semiconductor layer of the first conductivity type is formed on the inner wall part of the trench disposed in the semiconductor layer between adjacent ones of the pixels. The pixel separating section configured to separate the charge accumulating regions of adjacent ones of the pixels from each other is formed on the inside of the semiconductor layer of the first conductivity type.

Thereby, because the pixel separating section is formed further on the inside of the semiconductor layer of the first conductivity type on the inner wall part of the trench, the width of the pixel separating section can be made smaller than the width of the trench, and the width of the pixel separating section can be reduced.

In addition, because the epitaxially grown semiconductor layer of the first conductivity type can be used also as the charge accumulating region of the photoelectric conversion section, the area of the photoelectric conversion section can be increased.

The manufacturing method of the solid-state imaging device according to the above-described embodiment of the present disclosure includes: forming the trench in a region of the first conductivity type between adjacent ones of the pixels; and forming the semiconductor layer of the first conductivity type by epitaxial growth on the inner wall part of the trench. The method also includes: forming the pixel separating section separating the charge accumulating regions of adjacent ones of the pixels from each other on the inside of the semiconductor layer of the first conductivity type; and forming the pixels including the photoelectric conversion section and the pixel transistor, with the region of the first conductivity type in a part adjacent to the trench as the charge accumulating region.

Thereby, because the pixel separating section is formed further on the inside of the semiconductor layer of the first conductivity type on the inner wall part of the trench, the width of the pixel separating section can be made smaller than the width of the trench, and the width of the pixel separating section can be reduced.

In addition, because the region of the first conductivity type in the part adjacent to the trench having the semiconductor layer of the first conductivity type formed on the inner wall part thereof is set as the charge accumulating region, the charge accumulating region and the semiconductor layer of the first conductivity type are formed so as to be continuous with each other. Thereby, because the semiconductor layer of the first conductivity type can be used also as the charge accumulating region of the photoelectric conversion section, the area of the photoelectric conversion section can be increased.

The electronic device according to the above-described embodiment of the present disclosure includes: the solid-state imaging device having the constitution of the solid-state imaging device according to the above-described embodiment of the present disclosure; the optical system; and the signal processing circuit. Thereby, in the solid-state imaging device, the width of the pixel separating section configured to separate adjacent ones of the pixels from each other can be reduced, and the area of the photoelectric conversion section can be increased.

According to the above-described embodiments of the present disclosure, it is possible to reduce the width of the pixel separating section and increase the area of the photoelectric conversion section.

Reducing the width of the pixel separating section makes it possible to achieve size reduction and an increase in the number of pixels in the solid-state imaging device.

In addition, increasing the area of the photoelectric conversion section makes it possible to improve sensitivity and increase an amount of saturation charge Qs.

BRIEF DESCRIPTION OF THE DRAWINGS

FIG. 7 is a schematic configuration diagram (sectional view) of a constitution obtained by modifying the solid-state imaging device of FIG. 2;

DETAILED DESCRIPTION OF THE PREFERRED EMBODIMENTS

The best modes for carrying out the present disclosure (which best modes will hereinafter be referred to as embodiments) will be described below.

Incidentally, description will be made in the following order.
1. One Form of General Configuration of CMOS Solid-State Imaging Device
2. First Embodiment (Solid-State Imaging Device and Manufacturing Method)
3. Second Embodiment (Solid-State Imaging Device and Manufacturing Method)
4. Third Embodiment (Solid-State Imaging Device and Manufacturing Method)
5. Modification Examples of Solid-State Imaging Device
6. Fourth Embodiment (Solid-State Imaging Device and Manufacturing Method)
7. Fifth Embodiment (Electronic Device)

<1. One Form of General Configuration of CMOS Solid-State Imaging Device>

Figure 1:
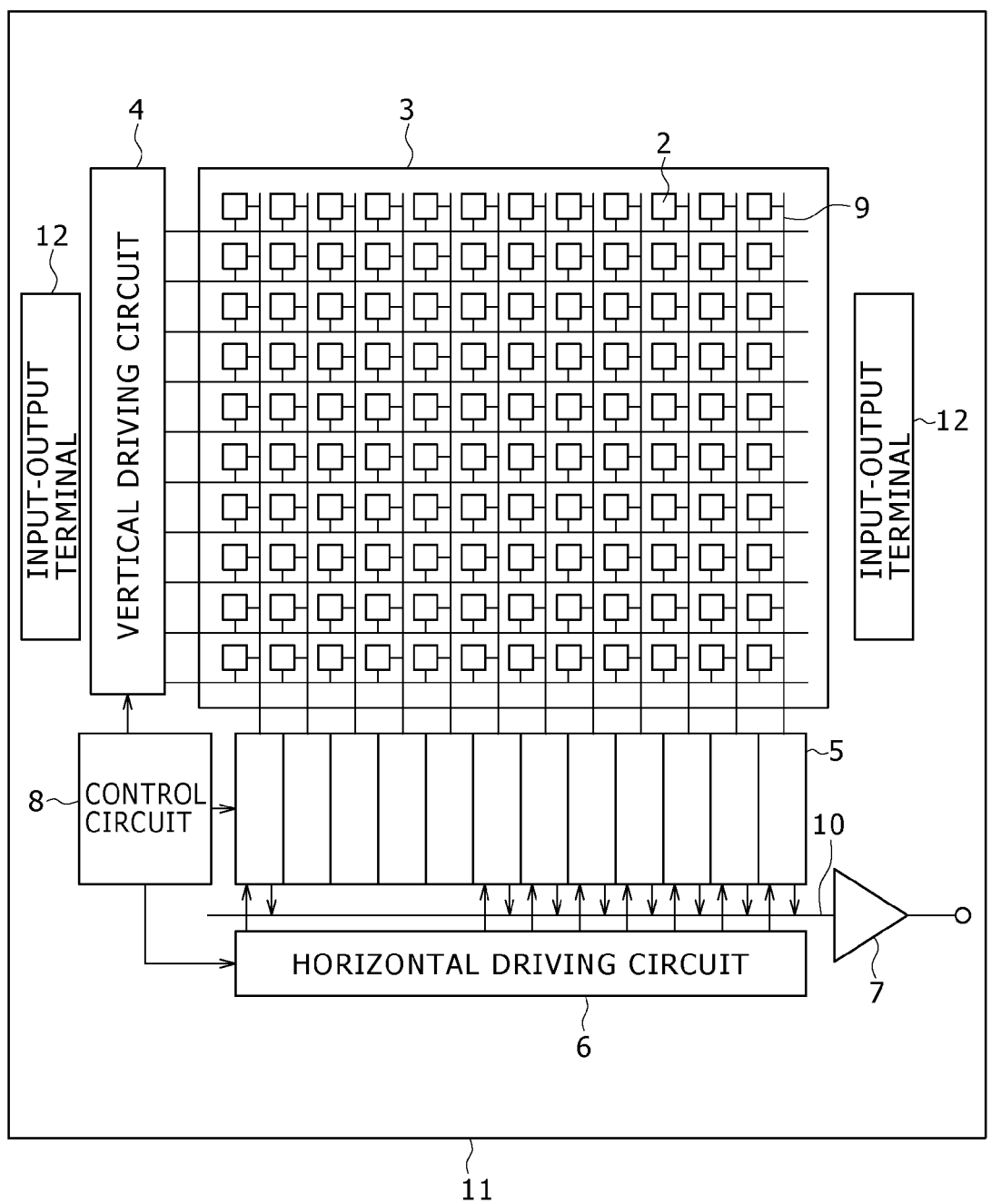
FIG. 1 is a schematic configuration diagram of one form of a solid-state imaging device applied to each embodiment.

FIG. 1 shows one form of general configuration of a CMOS solid-state imaging device applied to each embodiment to be described later.

A solid-state imaging device 1 includes a pixel region (so-called imaging region) 3 formed by regularly arranging a plurality of pixels 2 including a photoelectric conversion section in the form of a two-dimensional array on a semiconductor substrate 11 such as a silicon substrate, and further includes a peripheral circuit section on the periphery of the pixel region 3.

A unit pixel composed of one photoelectric conversion section and a plurality of pixel transistors can be applied as a pixel 2.

The plurality of pixel transistors can be formed by four transistors, that is, a transfer transistor, a reset transistor, an amplifying transistor, and a selecting transistor, or by the three transistors without the selecting transistor.

Incidentally, though not shown, a so-called pixel sharing structure can also be applied in which a plurality of photoelectric conversion sections in a pixel 2 share pixel transistors other than the transfer transistor.

The peripheral circuit section includes a vertical driving circuit 4, a column signal processing circuit 5, a horizontal driving circuit 6, an output circuit 7, and a control circuit 8.

The control circuit 8 receives an input clock and data instructing an operation mode and the like, and outputs data of internal information or the like of the solid-state imaging device 1. That is, the control circuit 8 generates a clock signal and a control signal serving as a basis for the operation of the vertical driving circuit 4, the column signal processing circuit 5, the horizontal driving circuit 6, and the like on the basis of a vertical synchronizing signal, a horizontal synchronizing signal, and a master clock. Then, the control circuit 8 inputs these signals to the vertical driving circuit 4, the column signal processing circuit 5, the horizontal driving circuit 6, and the like.

The vertical driving circuit 4 is formed by a shift register, for example. The vertical driving circuit 4 selects a pixel driving wiring, supplies the selected pixel driving wiring with a pulse for driving the pixels 2, and thereby drives the pixels 2 in a row-by-row basis. That is, the vertical driving circuit 4 supplies a pixel signal based on a signal charge generated according to an amount of light received in a photodiode, for example, as a photoelectric conversion element of each pixel 2 in the pixel region 3 to the column signal processing circuit 5.

The column signal processing circuit 5 is arranged for each column of the pixels 2. The column signal processing circuit 5 subjects signals output from the pixels 2 of one row to signal processing such as noise removal. Specifically, the column signal processing circuit 5 performs signal processing such as CDS (correlated double sampling) for removing fixed pattern noise unique to the pixels 2, signal amplification, AD (analog/digital) conversion, and the like. Though not shown, a horizontal selecting switch is provided to an output stage of the column signal processing circuit 5. The horizontal selecting switch is connected between the output stage of the column signal processing circuit 5 and a horizontal signal line 10.

The horizontal driving circuit 6 is formed by a shift register, for example. The horizontal driving circuit 6 selects each part of the column signal processing circuit 5 in order by sequentially outputting a horizontal scanning pulse, and makes a pixel signal output from each part of the column signal processing circuit 5 to the horizontal signal line 10.

The output circuit 7 subjects the signal sequentially supplied from each part of the column signal processing circuit 5 through the horizontal signal line 10 to signal processing, and then outputs a resulting signal. For example, the output circuit 7 may perform only buffering, or may perform black level adjustment, column variation correction, various digital signal processing, and the like.

An input-output terminal 12 exchanges signals with the outside.

<2. First Embodiment (Solid-State Imaging Device and Manufacturing Method)>

Figure 2:
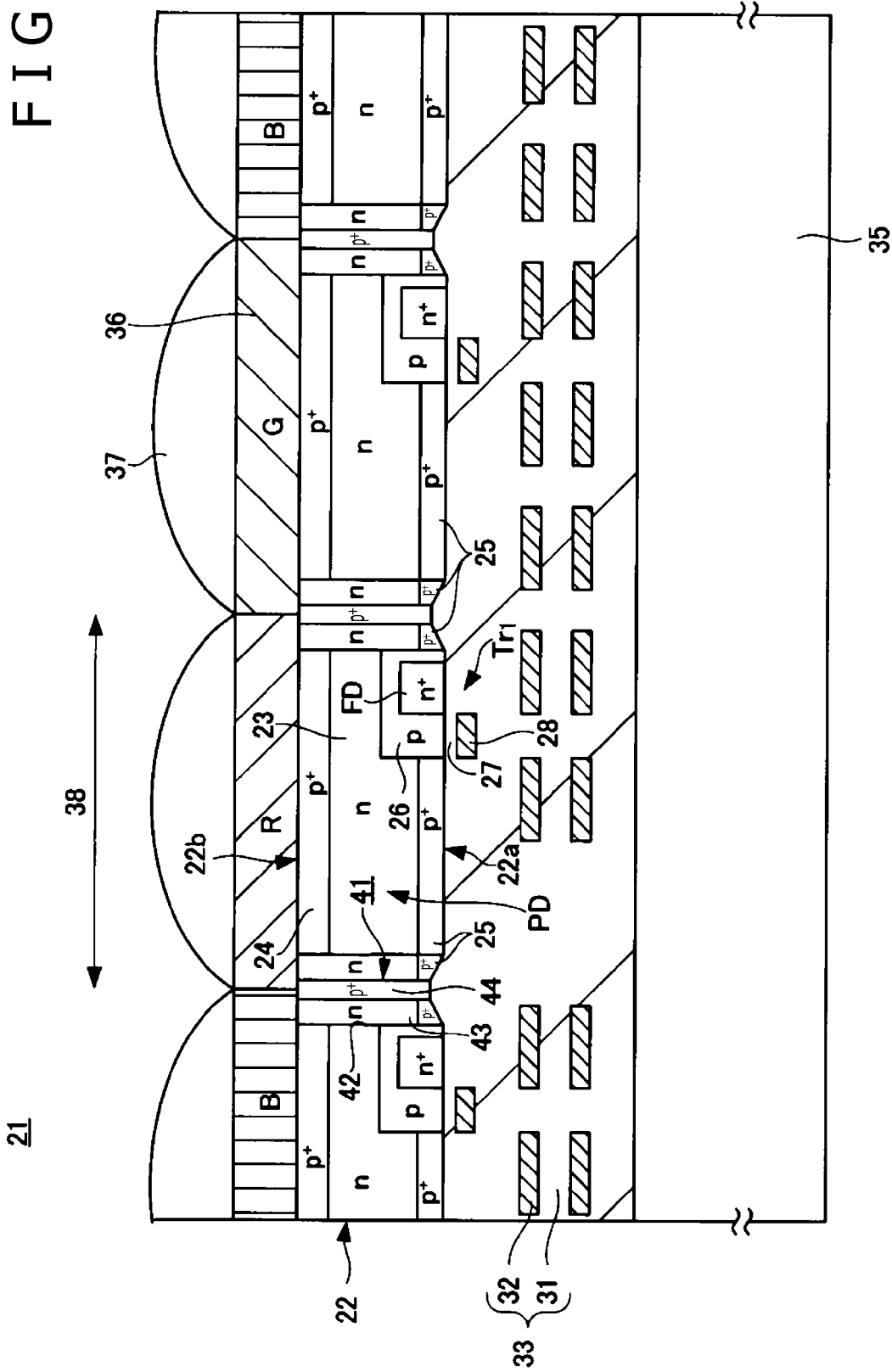
FIG. 2 is a schematic configuration diagram (sectional view) of a solid-state imaging device according to a first embodiment.

FIG. 2 is a schematic configuration diagram of a solid-state imaging device according to a first embodiment.

The present embodiment represents a case in which the present disclosure is applied to a CMOS solid-state imaging device of a back side illumination type.

In a manufacturing method according to the present embodiment, the CMOS solid-state imaging device of the back side illumination type is manufactured using an SOI (silicon on insulator) substrate.

As shown in FIG. 2, a solid-state imaging device 21 has a pixel region in which pixels 38 including a photodiode PD serving as a photoelectric conversion section and a plurality of pixel transistors are regularly arranged two-dimensionally in a semiconductor substrate (silicon layer or the like) 22, which is reduced in thickness.

The photodiode PD has a charge accumulating region 23 of a first conductivity type, or an n-type in FIG. 2, which is used for both photoelectric conversion and charge accumulation, and semiconductor regions 24 and 25 of a second conductivity type, or a p-type in FIG. 2, which is used for dark current suppression at both front and back interfaces of the charge accumulating region 23, each of the charge accumulating region 23 and the semiconductor regions 24 and 25 being formed in the semiconductor substrate 22. The photodiode PD is formed so as to be extended below a plurality of pixel transistors.

The plurality of pixel transistors are formed in a p-type semiconductor well region 26 formed on the side of a front surface 22a of the semiconductor substrate 22. Incidentally, in FIG. 2, the plurality of pixel transistors are represented by a transfer transistor $Tr_1$, which is one of the plurality of pixel transistors. The transfer transistor $Tr_1$ has the photodiode PD as a source thereof, has a floating diffusion FD formed by an n-type semiconductor region as a drain thereof, and has a transfer gate electrode 28 formed with a gate insulating film 27 interposed between the p-type semiconductor well region 26 and the transfer gate electrode 28.

A multilayer wiring layer 33 having a plurality of wiring layers 32 arranged with an interlayer insulating layer 31 interposed between the plurality of wiring layers 32 is formed on the front surface side of the semiconductor substrate 22. A supporting substrate 35 is laminated onto the multilayer wiring layer 33. Because of the back side illumination type, there is no limitation to the arrangement of the wiring layers 32, and the wiring layers 32 are formed also at a position corresponding to the photodiode PD.

A back surface 22b of the semiconductor substrate 22 on the opposite side from the multilayer wiring layer 33 is a light receiving surface. An insulating film such as an antireflection film (not shown), a light shielding film (not shown) for blocking the incidence of incident light on adjacent pixels, and the like are formed on the back surface 22b.

Further, a color filter 36 and an on-chip lens 37 are formed on the back surface 22b side of the semiconductor substrate 22.

Light made incident on the solid-state imaging device 21 passes through the on-chip lens 37 and the color filter 36, and is applied to the photodiode PD from the side of the back surface 22b of the semiconductor substrate 22.

Incidentally, the n-type charge accumulating region 23 of the photodiode PD preferably has a concentration distribution such that the impurity concentration of the charge accumulating region 23 is high on the side of the front surface 22a of the semiconductor substrate 22 and is decreased from the side of the front surface 22a to the side of the back surface 22b. Such a concentration distribution facilitates the movement of a charge resulting from photoelectric conversion in the vicinity of the back surface 22b of the semiconductor substrate 22 to the side of the front surface 22a.

In the present embodiment, a trench 42 is formed in the semiconductor substrate 22, and epitaxially grown semiconductor layers 43 are buried within the trench 42. The semiconductor layers 43 are formed by an n-type semiconductor layer of the same conductivity type as the n-type charge accumulating region 23 of the photodiode PD.

In the present embodiment, in particular, an epitaxially grown p-type high-concentration (p+) semiconductor layer 44 is formed on the inside of the epitaxially grown n-type semiconductor layers 43, and the p-type semiconductor layer 44 forms a pixel separating section 41 configured to separate pixels from each other. Incidentally, the p-type semiconductor layer 44 is exposed at the interface of the back surface 22b of the semiconductor substrate 22.

In a manufacturing method as described later, the n-type semiconductor layers 43 and the p-type semiconductor layer 44 are sequentially grown epitaxially within the trench 42 to form the pixel separating section 41.

The n-type semiconductor layers 43 are of the same conductivity type as the n-type charge accumulating region 23 of the photodiode PD. The semiconductor layers 43 can therefore widen the photoelectric conversion section.

The n-type semiconductor layers 43 desirably have an n-type impurity concentration nearly equal to that of the n-type charge accumulating region 23 of the photodiode PD.

In addition, because the p-type semiconductor layer 44 is formed by epitaxial growth, the spread of an impurity in a lateral direction (horizontal direction) as in an impurity region formed by ion implantation does not occur in the p-type semiconductor layer 44. Thus, a uniform impurity concentration is maintained.

In the present embodiment, the solid-state imaging device 21 shown in FIG. 2 is manufactured using an SOI substrate.

The solid-state imaging device 21 shown in FIG. 2 can be manufactured as described in the following, for example.

Figure 3A:
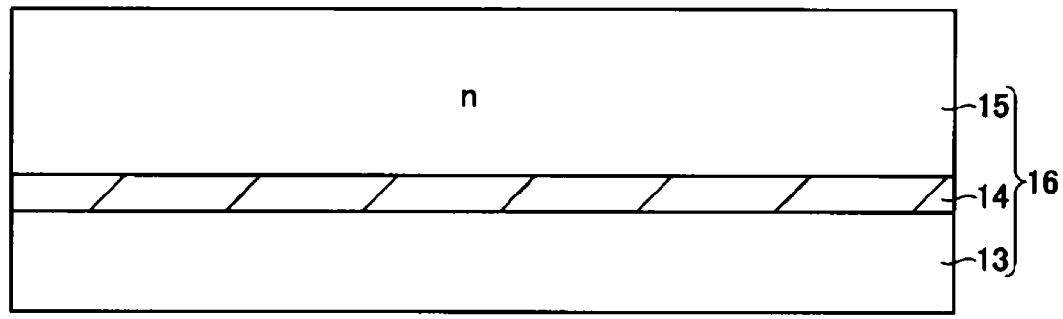
FIGS. 3A to 3C are manufacturing process diagrams showing a manufacturing method of the solid-state imaging device according to the first embodiment.

First, as shown in FIG. 3A, an SOI substrate 16 in which a bulk silicon substrate 13, a Box layer (silicon oxide film) 14, and a silicon layer 15 are laminated in order from an underlying layer is prepared.

Then, the silicon layer 15 of the SOI substrate 16 is subjected to ion implantation with an n-type impurity to form an active silicon layer.

Figure 3B:
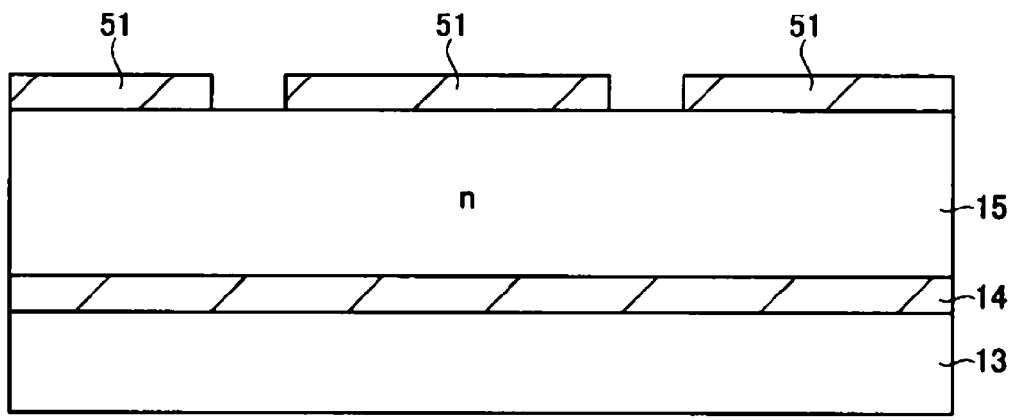

Next, a mask material (for example a SiO film) 51 is formed on the silicon layer 15 as a barrier at times of the formation of a trench 42 and epitaxial growth. Then, as shown in FIG. 3B, the mask material 51 is patterned so as to have an opening in a part to form a pixel separating section for separating photodiodes PD from each other.

Figure 3C:
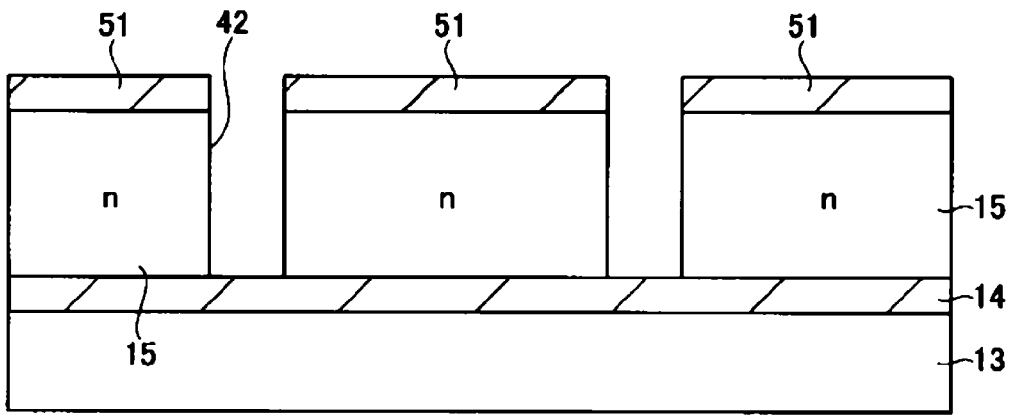

Next, as shown in FIG. 3C, processing is performed to form the trench 42 with the patterned mask material 51 as a mask. The trench 42 has such a depth as to penetrate the silicon layer 15 and be stopped at the Box layer 14.

Figure 3D:
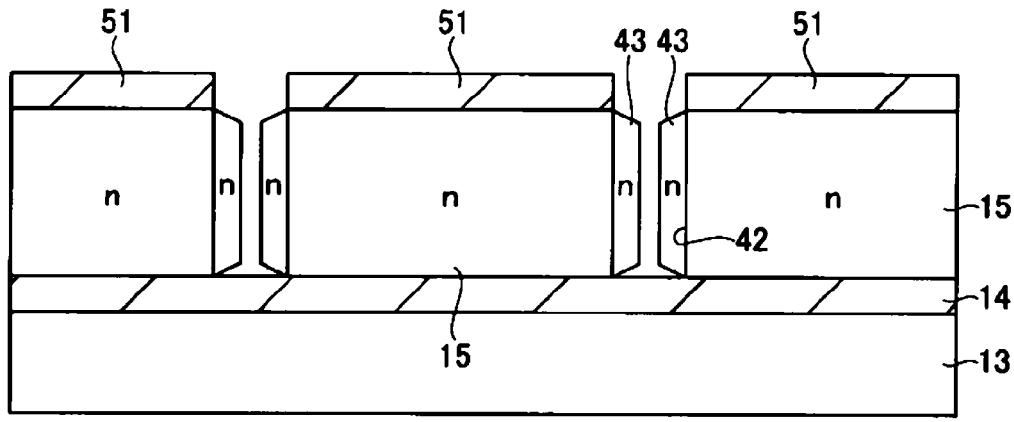
FIGS. 3D to 3F are manufacturing process diagrams showing the manufacturing method of the solid-state imaging device according to the first embodiment.

Next, as shown in FIG. 3D, the n-type semiconductor layers 43 doped with an n-type impurity (for example phosphorus P or arsenic As) are formed within the trench 42 by epitaxial growth at a temperature of about 700° C.

At this time, because no epitaxial growth occurs on surfaces of oxides, the n-type semiconductor layers 43 are not formed on the mask material 51 or the Box layer 14, but the n-type semiconductor layers 43 are epitaxially grown only on side wall parts of the trench 42 in the silicon layer 15.

Then, the epitaxial growth is stopped before the n-type semiconductor layers 43 epitaxially grown from both inner walls of the trench 42 stick together, that is, in a state of there being a space between the n-type semiconductor layers 43.

Conditions for the epitaxial growth when the n-type semiconductor layers 43 are formed can be set as follows, for example.

Substrate Temperature: 750 to 850° C.
Pressure within Chamber: 10 to 760 Torr
$SiH_2Cl_2$ (DCS) Flow Rate: 10 to 100 sccm
HCl Flow Rate: 10 to 300 sccm
$H_2$ Flow Rate: 10 to 50 slm
$PH_3$ (50 ppm/$H_2$): 0.01 to 10 sccm Incidentally, thereafter, as required, the n-type semiconductor layers 43 may be further subjected to ion implantation with an n-type impurity so that the silicon layer 15 as the charge accumulating region 23 of the photodiode PD and the n-type semiconductor layers 43 have about the same n-type impurity concentration.

Figure 3E:
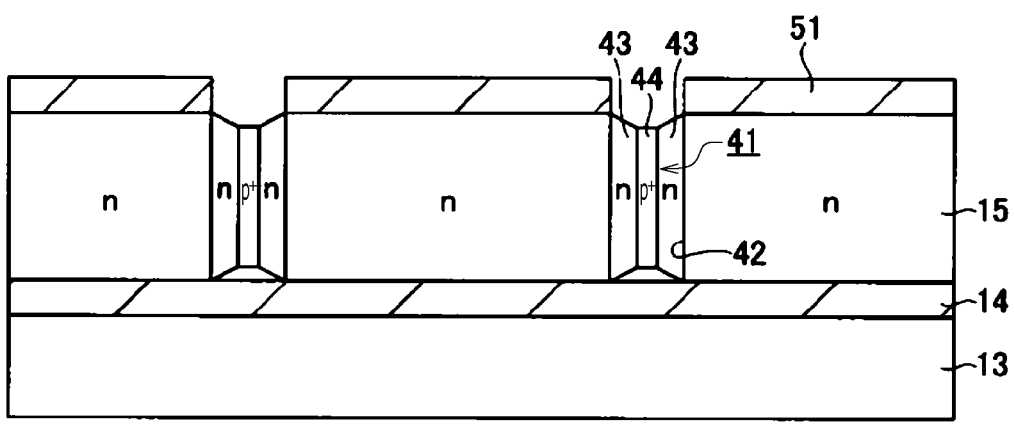

Next, the type of dopants is changed to a p-type impurity (for example boron B or $BF_2$), and as shown in FIG. 3E, the p-type semiconductor layer 44 is formed by epitaxial growth at a temperature of about 700° C.

Thereby, the p-type semiconductor layer 44 is formed so as to fill the space between the n-type semiconductor layers 43 formed on both inner walls of the trench 42.

At this time, because no epitaxial growth occurs on surfaces of oxides, the p-type semiconductor layer 44 is not formed on the mask material 51 or the Box layer 14, but the p-type semiconductor layer 44 is epitaxially grown only on the inner walls of the n-type semiconductor layers 43.

Thus, the n-type semiconductor layers 43 and the p-type semiconductor layer 44 are formed so as to float above the Box layer 14, and are formed so as to be recessed downward from the interface between the silicon layer 15 and the mask material 51. The n-type semiconductor layers 43 and the p-type semiconductor layer 44 therefore have facets as an upper and a lower surfaces thereof.

Conditions for the epitaxial growth when the p-type semiconductor layer 44 is formed can be set as follows, for example.

Figure 3F:
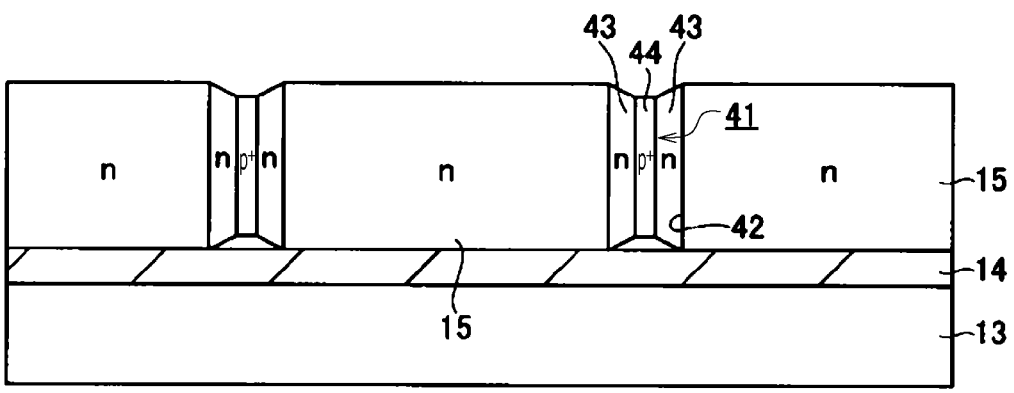

Substrate Temperature: 750 to 850° C.
Pressure within Chamber: 10 to 760 Torr
$SiH_2Cl_2$ (DCS) Flow Rate: 10 to 100 sccm
HCl Flow Rate: 10 to 300 sccm
$H_2$ Flow Rate: 10 to 50 slm
$B_2H_6$ (100 ppm/$H_2$): 0.01 to 10 sccm Next, as shown in FIG. 3F, the mask material 51 on the surface of the silicon layer 15 is removed by using for example a wet chemical solution (DHF (dilute hydrofluoric acid) or the like).

Next, annealing treatment at about 800° C., for example, is performed for the activation of the n-type semiconductor layers 43 and the p-type semiconductor layer 44 buried in the trench 42 and the recovery of a crystal at the interface of the trench 42. A heat treatment in a subsequent process can also be made to double as this annealing treatment.

Figure 3G:
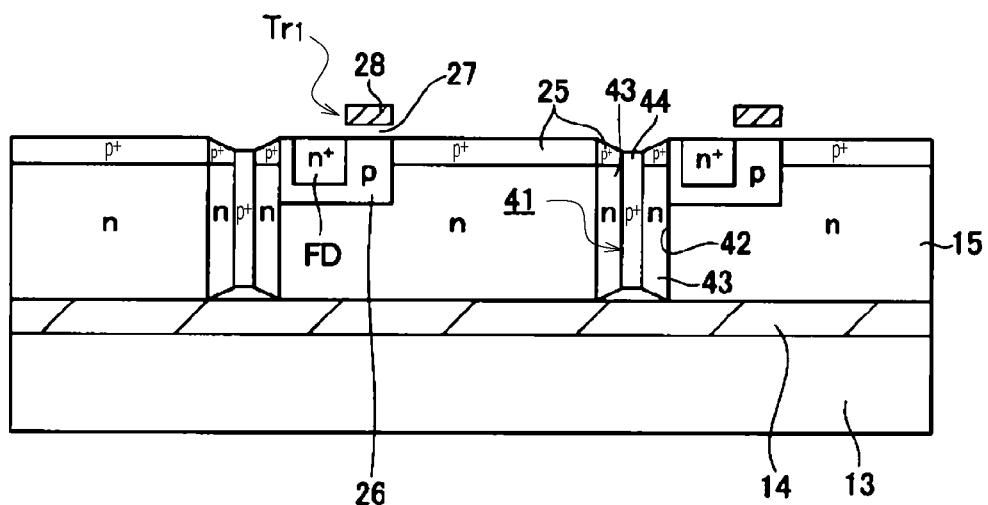
FIGS. 3G and 3H are manufacturing process diagrams showing the manufacturing method of the solid-state imaging device according to the first embodiment.

Thereafter, as shown in FIG. 3G, respective parts forming a photodiode PD (see FIG. 2), pixel transistors such as a transfer transistor $Tr_1$, and a floating diffusion FD are formed on the upper surface side of the silicon layer 15.

Specifically, the p-type semiconductor well region 26 is formed in part of the upper surface side of the silicon layer 15 corresponding to each pixel separated by the pixel separating section 41.

In addition, the p-type semiconductor region 25 serving also as an accumulation layer for reducing dark current is formed in the vicinity of the upper surface of the n-type silicon layer 15 in each pixel 38. At this time, the p-type semiconductor region 25 is formed also in the vicinity of the upper surfaces of the n-type semiconductor layers 43, and therefore parts in the vicinity of the upper surfaces of the n-type semiconductor layers 43 are changed from the n-type to the p-type.

Further, the floating diffusion FD made of an n-type semiconductor region is formed in the p-type semiconductor well region 26.

Then, the transfer gate electrode 28 is formed above the p-type semiconductor well region 26 between the floating diffusion FD and the p-type semiconductor region 25, with the gate insulating film 27 interposed between the transfer gate electrode 28 and the p-type semiconductor well region 26, whereby the transfer transistor $Tr_1$ is formed. At the same time as the formation of the transfer transistor $Tr_1$, other pixel transistors composed of a pair of source/drain regions and a gate electrode are formed in other parts of the p-type semiconductor well region 26. Further, the peripheral circuit section is formed by using CMOS transistors in the periphery of the pixel region.

Figure 3H:
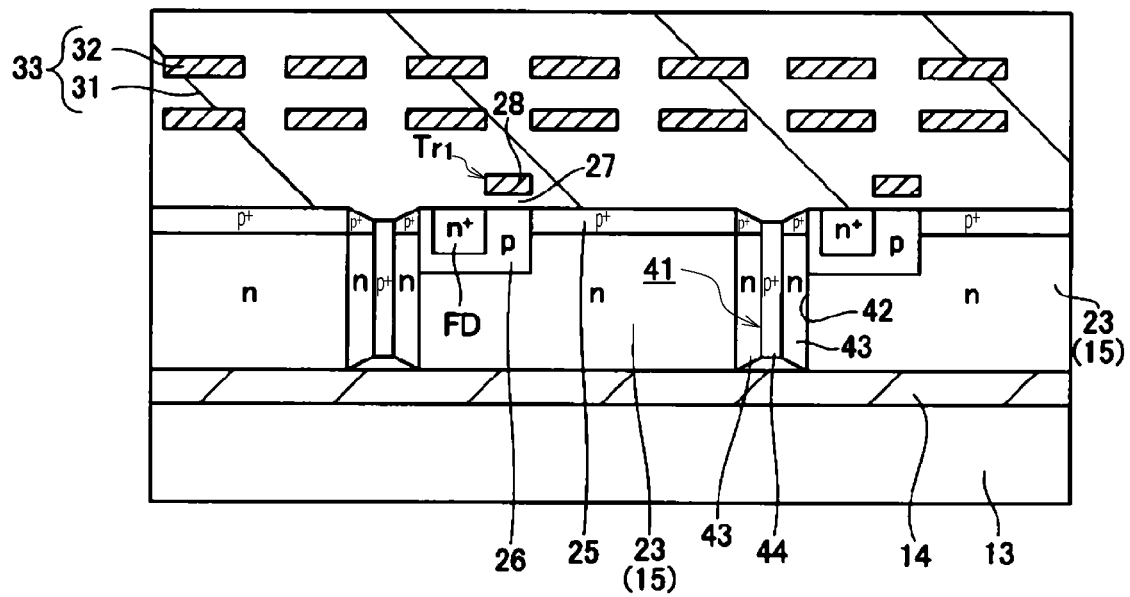

Next, as shown in FIG. 3H, the multilayer wiring layer 33 is formed by arranging the plurality of wiring layers 32 with the interlayer insulating layer 31 interposed therebetween.

Incidentally, a space on the facet structure on the upper surface side of the n-type semiconductor layers 43 and the p-type semiconductor layer 44 is filled with the insulating material of the gate insulating film 27, the interlayer insulating layer 31, or the like.

In addition, the n-type charge accumulating region 23 is formed by the n-type silicon layer 15 in the part of the photodiode PD.

Figure 3I:
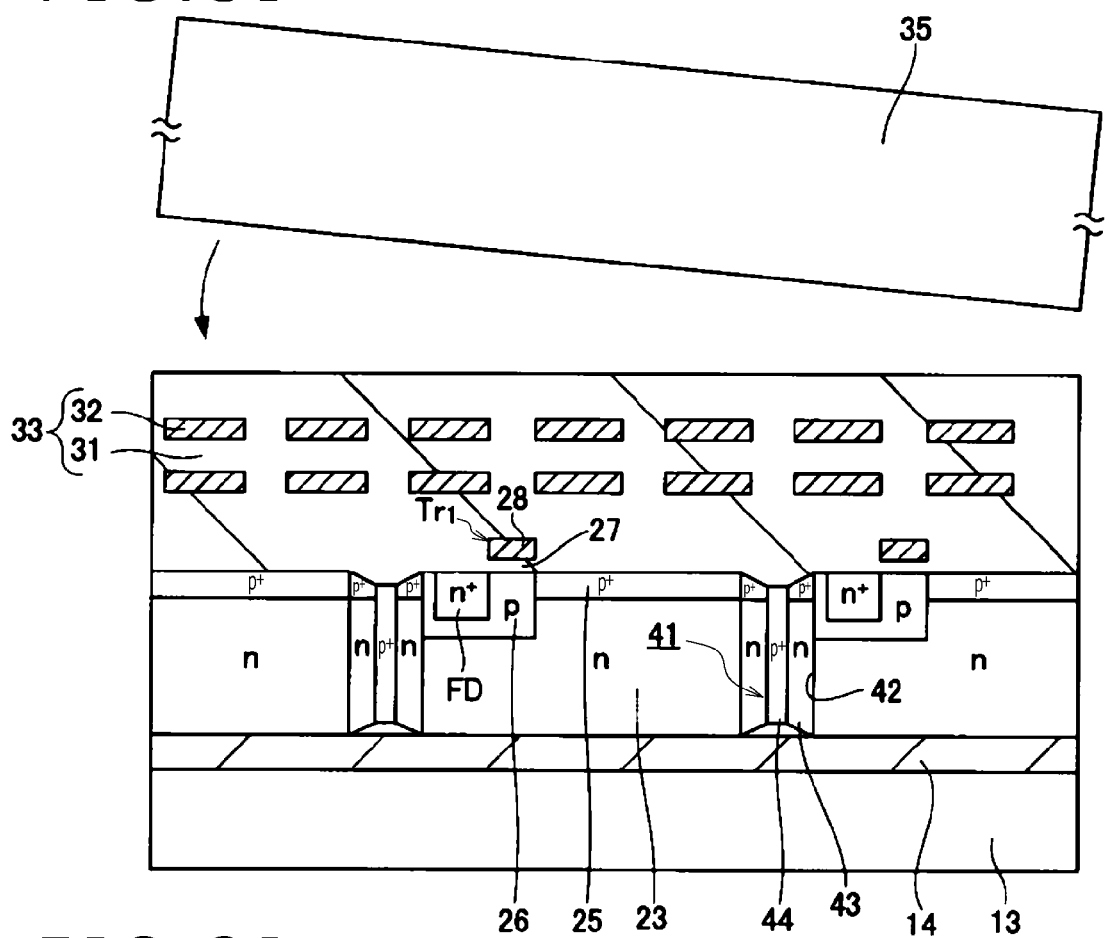
FIGS. 3I and 3J are manufacturing process diagrams showing the manufacturing method of the solid-state imaging device according to the first embodiment.

Thereafter, as shown in FIG. 3I, the supporting substrate 35 formed by a silicon substrate, for example, is laminated onto the multilayer wiring layer 33.

Figure 3J:
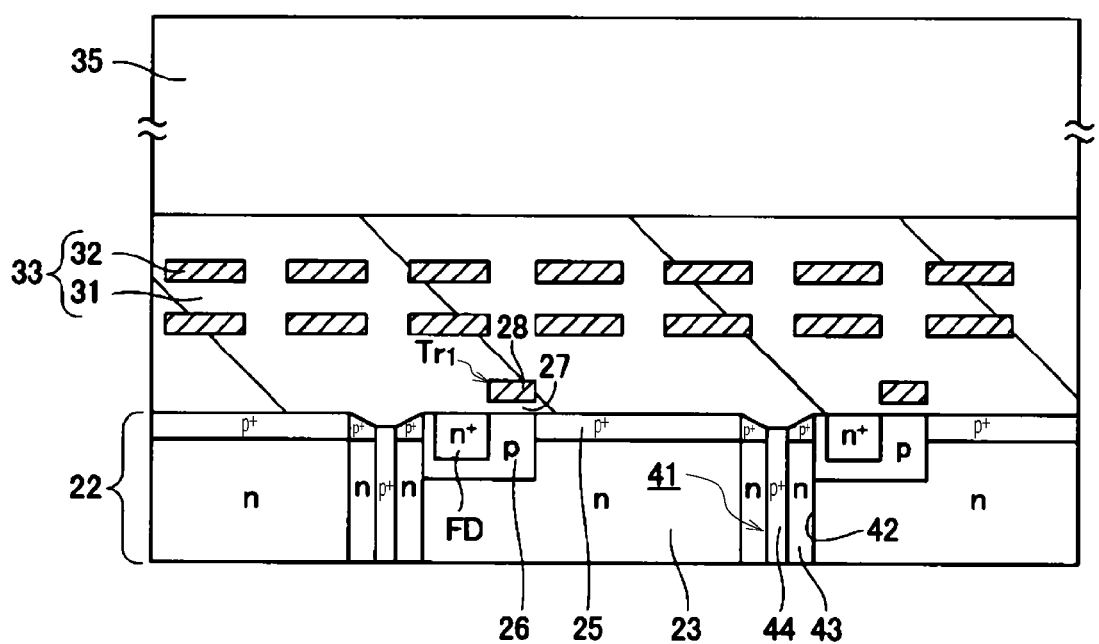

Thereafter, as shown in FIG. 3J, a back surface side is polished to remove the silicon substrate 13 and the Box layer 14 of the SOI substrate 16, and the back surface side of the semiconductor substrate 22 formed of the silicon layer 15 is also polished.

At this time, the facet structure on the back surface side of the n-type semiconductor layers 43 and the p-type semiconductor layer 44 is removed by the polishing, and thus the back surface side is substantially planarized.

Thereafter, though not shown, the structure is inverted, and the p-type semiconductor region 24 is formed by ion implantation at the vicinity of an interface on the back surface side of the semiconductor substrate 22.

Further, the color filter 36 and the on-chip lens 37 are sequentially formed on the semiconductor substrate 22.

The solid-state imaging device 21 shown in FIG. 2 can be thus manufactured.

Incidentally, the facet structures present at the upper and lower parts of the n-type semiconductor layers 43 and the p-type semiconductor layer 44 form depression parts in which the semiconductor is recessed from the other parts. Because an insulator and a semiconductor have different light reflectances, the parts of the facet structures can be determined when irradiated with light.

Therefore the facet structures can also be used as an alignment mark at a time of a manufacturing process.

In the solid-state imaging device 21 according to the above-described present embodiment, the pixel separating section 41 is formed by the epitaxially grown p-type semiconductor layer 44 on the inside of the epitaxially grown n-type semiconductor layers 43 formed so as to be buried in the trench 42.

Thereby, the width of the pixel separating section 41 can be reduced as compared with a related-art structure, and the width of the pixel separating section 41 can be made smaller than the width of the trench 42. Even when the trench 42 is formed so as to be of a stable width with a necessary margin, the width of the pixel separating section 41 can be sufficiently made small.

Further, the p-type semiconductor layer 44 grown by epitaxial growth is free from implantation defects caused by ion implantation, and functions as a hole pinning layer.

On the other hand, the trench 42 recovers from etching damage in the annealing treatment before the formation of the multilayer wiring layer 33.

Thus, in the pixel separating section 41, the p-type semiconductor layer 44 is formed as a pinning layer without etching damage to the trench 42. It is therefore possible to suppress the occurrence of luminous dots or dark current at the interfaces of the pixel separating section 41 without any heat effect on the wiring layers 32.

In addition, because the p-type semiconductor layer 44 is formed by epitaxial growth, the p-type semiconductor layer 44 does not spread in the lateral direction even at a deep position of the semiconductor substrate 22 unlike an ion implantation region, a uniform impurity concentration is maintained, and a high electric field strength can be maintained in the vicinity of the back surface 22b of the semiconductor substrate 22. It is thereby possible to improve the separating capability of the pixel separating section 41, block a leakage of a charge resulting from photoelectric conversion into adjacent pixels 38, suppress color mixture, and improve sensitivity.

In the solid-state imaging device 21 according to the present embodiment, the n-type semiconductor layers 43 are of the same conductivity type as the n-type charge accumulating region 23 of the photodiode PD. Therefore the area of the photodiode can be increased by the semiconductor layers 43.

Because the area of the photodiode can be increased, sensitivity can be improved also in this respect, and an amount of saturation charge Qs can be increased. In addition, even when the number of pixels is increased, it is possible to secure photodiodes having a certain area, and thus obtain sufficient sensitivity.

On the other hand, when the area of the photodiode is equal to that of the related-art constitution, the width of the trench 42 can be made larger than the width of the pixel separating section 41. It is thereby possible to relax the aspect ratio of the trench 42, and thus increase margins for lithography and processing at the time of formation of the trench 42.

The solid-state imaging device 21 according to the present embodiment can suppress color mixture and improve sensitivity. Thus, even when the number of pixels is increased, the solid-state imaging device 21 having high sensitivity and a wide dynamic range and providing excellent image quality can be realized.

In addition, according to the manufacturing method of the present embodiment, the n-type semiconductor layers 43 and the p-type semiconductor layer 44 are buried by epitaxial growth within the trench 42, whereby the pixel separating section 41 is formed.

Thus, because the p-type semiconductor layer 44 is buried by epitaxial growth, the p-type semiconductor layer 44 is free from ion implantation defects, and is formed as an excellent hole pinning layer.

It is therefore possible to manufacture the solid-state imaging device 21 of the back side illumination type that can suppress the occurrence of luminous dots and dark current as well as color mixture and can improve sensitivity.

<3. Second Embodiment (Solid-State Imaging Device and Manufacturing Method)>

The present embodiment also represents a case in which the present disclosure is applied to a CMOS solid-state imaging device of a back side illumination type.

In a manufacturing method according to the present embodiment, the CMOS solid-state imaging device of the back side illumination type is manufactured using a bulk substrate.

Incidentally, in the present embodiment, suppose that the constitution of the solid-state imaging device is similar to that of the solid-state imaging device 21 according to the first embodiment shown in FIG. 2. Therefore repeated description will be omitted.

In the present embodiment, the solid-state imaging device 21 shown in FIG. 2 is manufactured using a bulk substrate.

For example, the solid-state imaging device 21 shown in FIG. 2 can be manufactured as described in the following.

Figure 4A:
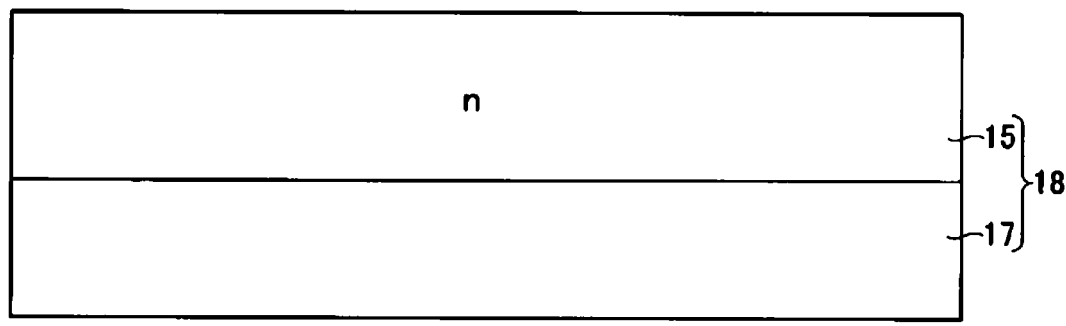
FIGS. 4A to 4C are manufacturing process diagrams showing a manufacturing method of a solid-state imaging device according to a second embodiment.

First, as shown in FIG. 4A, the n-type silicon layer 15 and a bulk layer 17 are formed by introducing an n-type impurity into an upper part of a bulk silicon substrate 18.

Suppose that the bulk layer 17 has a constitution of an impurity concentration similar to that of the original silicon substrate 18, for example a low n-type or p-type impurity concentration, or a constitution without an n-type impurity or a p-type impurity.

Figure 4B:
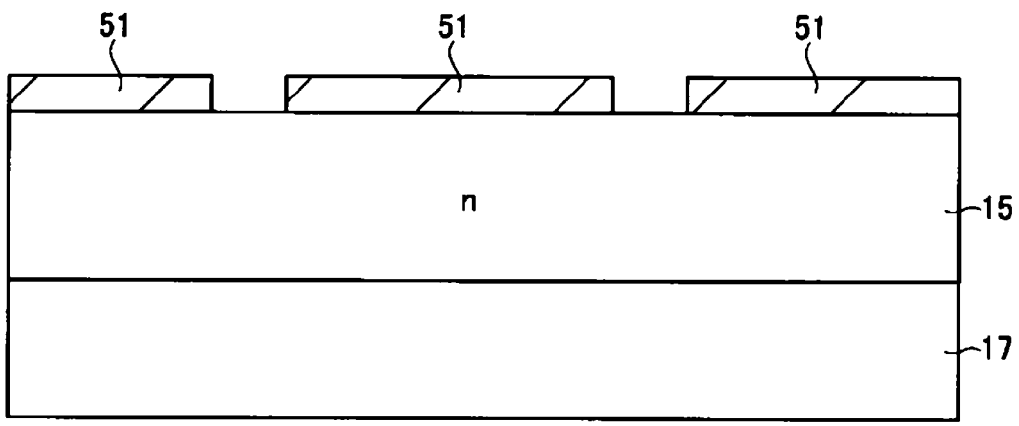

Next, the mask material (for example SiO film) 51 is formed on the silicon layer 15 as a barrier at times of the formation of the trench 42 and epitaxial growth. Then, as shown in FIG. 4B, the mask material 51 is patterned so as to have an opening in a part to form the pixel separating section configured to separate the photodiodes PD from each other.

Figure 4C:
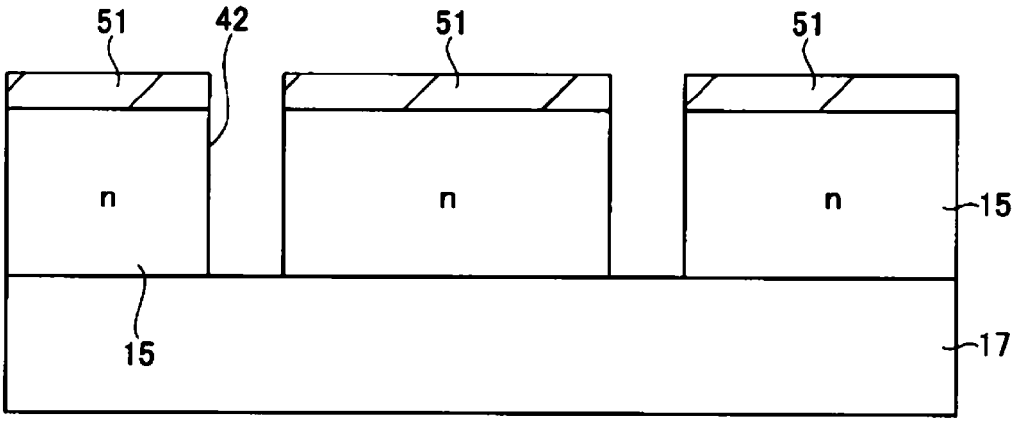

Next, as shown in FIG. 4C, processing is performed to form the trench 42 with the patterned mask material 51 as a mask. Conditions such as a processing time are controlled such that the trench 42 has such a depth as to penetrate the silicon layer 15 and be stopped at the bulk layer 17.

Figure 4D:
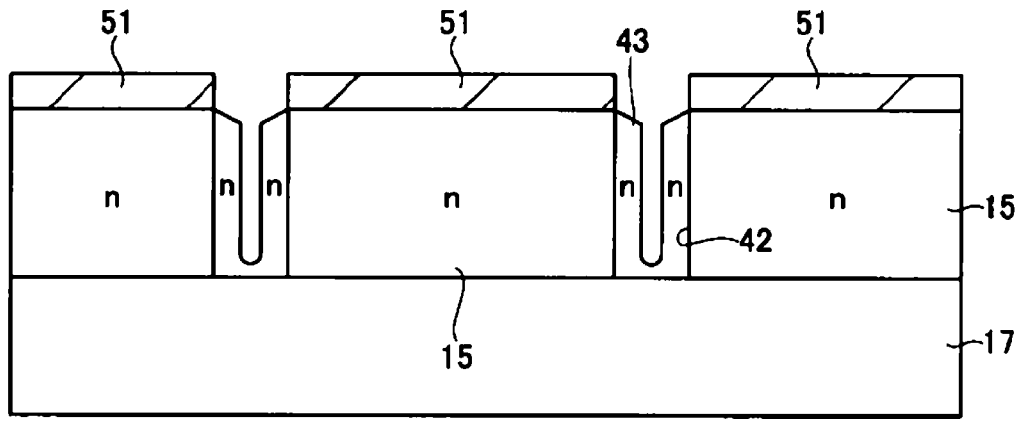
FIGS. 4D to 4F are manufacturing process diagrams showing the manufacturing method of the solid-state imaging device according to the second embodiment.

Next, as shown in FIG. 4D, the n-type semiconductor layer 43 doped with an n-type impurity (for example phosphorus P or arsenic As) is formed within the trench 42 by epitaxial growth at a temperature of about 700° C.

At this time, because no epitaxial growth occurs on surfaces of oxides, the n-type semiconductor layer 43 is not formed on the mask material 51, but the n-type semiconductor layer 43 is epitaxially grown on side wall parts of the trench 42 in the silicon layer 15 and the bulk layer 17. Because the n-type semiconductor layer 43 is epitaxially grown also on the upper surface of the bulk layer 17, the n-type semiconductor layer 43 has a shape continuous from the bottom part of the trench 42 to the side wall parts of the trench 42.

Then, the epitaxial growth is stopped before the side wall parts of the n-type semiconductor layer 43 epitaxially grown from both inner walls of the trench 42 stick together, that is, in a state of there being a space between the side wall parts of the n-type semiconductor layer 43.

Incidentally, thereafter, as required, the n-type semiconductor layer 43 may be further subjected to ion implantation with an n-type impurity so that the silicon layer 15 as the charge accumulating region 23 of the photodiode PD and the n-type semiconductor layer 43 have about the same n-type impurity concentration.

Conditions for the epitaxial growth when the n-type semiconductor layer 43 is formed can be set similar to those of the first embodiment.

Figure 4E:
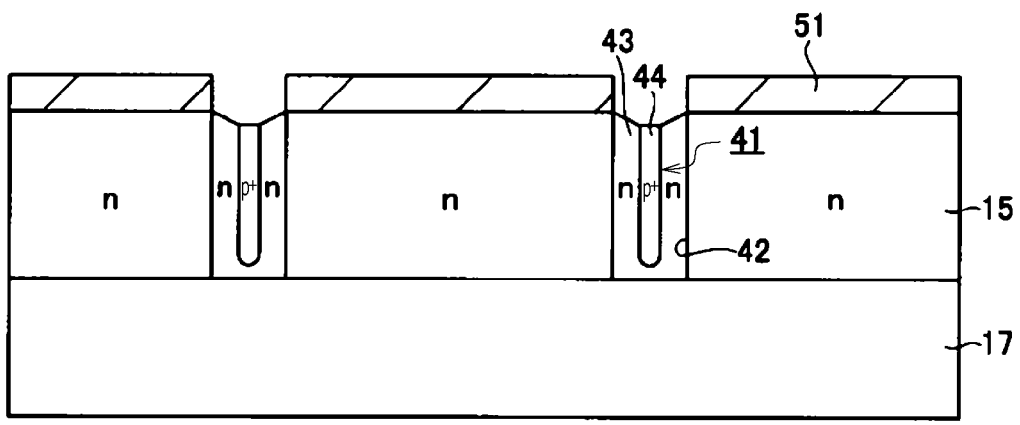

Next, the type of dopants is changed to a p-type impurity (for example boron B or $BF_2$), and as shown in FIG. 4E, the p-type semiconductor layer 44 is formed by epitaxial growth at a temperature of about 700° C.

Thereby, the p-type semiconductor layer 44 is formed so as to fill the space within the n-type semiconductor layer 43 formed on both inner walls of the trench 42.

At this time, because no epitaxial growth occurs on surfaces of oxides, the p-type semiconductor layer 44 is not formed on the mask material 51, but the p-type semiconductor layer 44 is epitaxially grown only on the inner walls and the bottom part of the n-type semiconductor layer 43.

Thus, the n-type semiconductor layer 43 and the p-type semiconductor layer 44 are formed so as to be recessed downward from the interface between the silicon layer 15 and the mask material 51. The n-type semiconductor layer 43 and the p-type semiconductor layer 44 therefore have facets as an upper surface thereof.

Conditions for the epitaxial growth when the p-type semiconductor layer 44 is formed can be similar to those of the first embodiment.

Figure 4F:
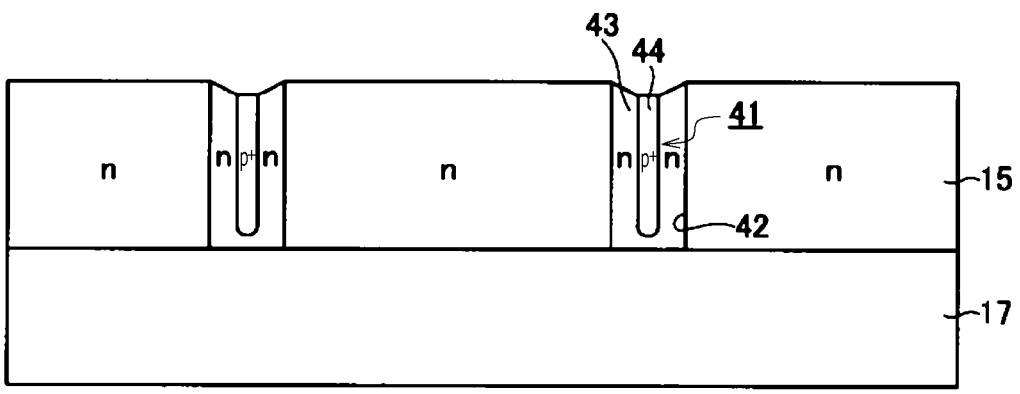

Next, as shown in FIG. 4F, the mask material 51 on the surface of the silicon layer 15 is removed by using for example a wet chemical solution (DHF or the like).

Next, annealing treatment at about 800° C., for example, is performed for the activation of the n-type semiconductor layer 43 and the p-type semiconductor layer 44 buried in the trench 42 and the recovery of a crystal at the interface of the trench 42. A heat treatment in a subsequent process can also be made to double as this annealing treatment.

Figure 4G:
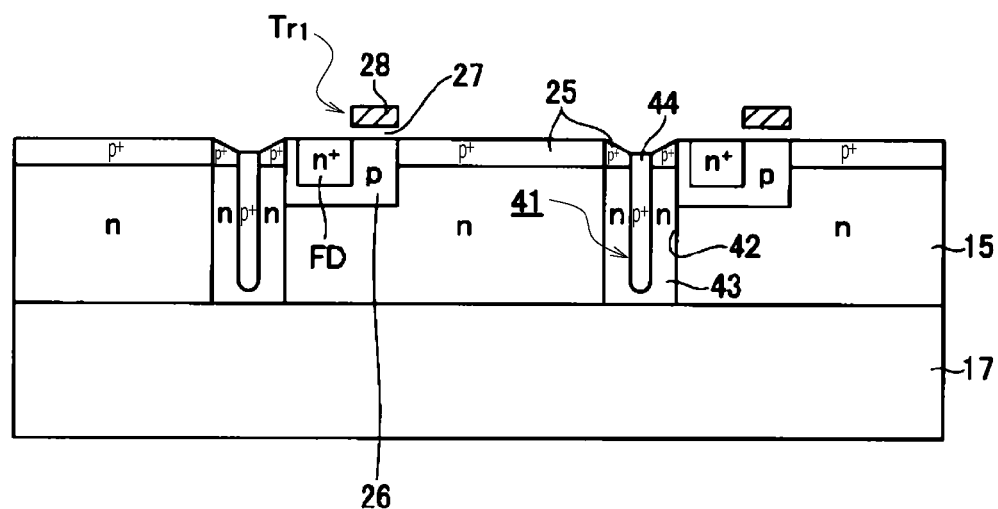
FIGS. 4G and 4H are manufacturing process diagrams showing the manufacturing method of the solid-state imaging device according to the second embodiment.

Thereafter, as shown in FIG. 4G, the respective parts forming the photodiode PD, the pixel transistors such as a transfer transistor $Tr_1$, and the floating diffusion FD are formed on the upper surface side of the silicon layer 15.

Specifically, the p-type semiconductor well region 26 is formed in part of the upper surface side of the silicon layer 15 corresponding to each pixel separated by the pixel separating section 41.

In addition, the p-type semiconductor region 25 serving also as an accumulation layer for reducing dark current is formed in the vicinity of the upper surface of the n-type silicon layer 15 in each pixel 38. At this time, the p-type semiconductor region 25 is formed also in the vicinity of the upper surfaces of the n-type semiconductor layer 43, and therefore parts in the vicinity of the upper surfaces of the n-type semiconductor layer 43 are changed from the n-type to the p-type.

Further, the floating diffusion FD made of an n-type semiconductor region is formed in the p-type semiconductor well region 26.

Then, the transfer gate electrode 28 is formed above the p-type semiconductor well region 26 between the floating diffusion FD and the p-type semiconductor region 25, with the gate insulating film 27 interposed between the transfer gate electrode 28 and the p-type semiconductor well region 26, whereby the transfer transistor $Tr_1$ is formed. At the same time as the formation of the transfer transistor $Tr_1$, other pixel transistors composed of a pair of source/drain regions and a gate electrode are formed in other parts of the p-type semiconductor well region 26. Further, the peripheral circuit section is formed by using CMOS transistors in the periphery of the pixel region.

Figure 4H:
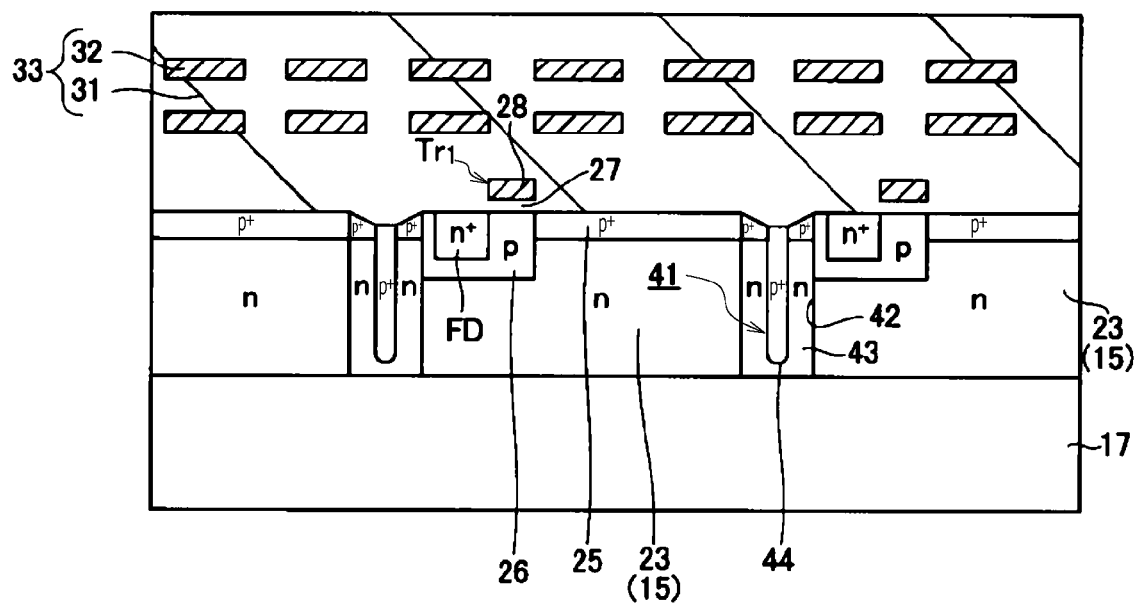

Next, as shown in FIG. 4H, the multilayer wiring layer 33 is formed by arranging the plurality of wiring layers 32 with the interlayer insulating layer 31 interposed therebetween.

Incidentally, a space on the facet structure on the upper surface side of the n-type semiconductor layer 43 and the p-type semiconductor layer 44 is filled with the insulating material of the gate insulating film 27, the interlayer insulating layer 31, or the like.

In addition, the n-type charge accumulating region 23 is formed by the n-type silicon layer 15 in the part of the photodiode PD.

Figure 4I:
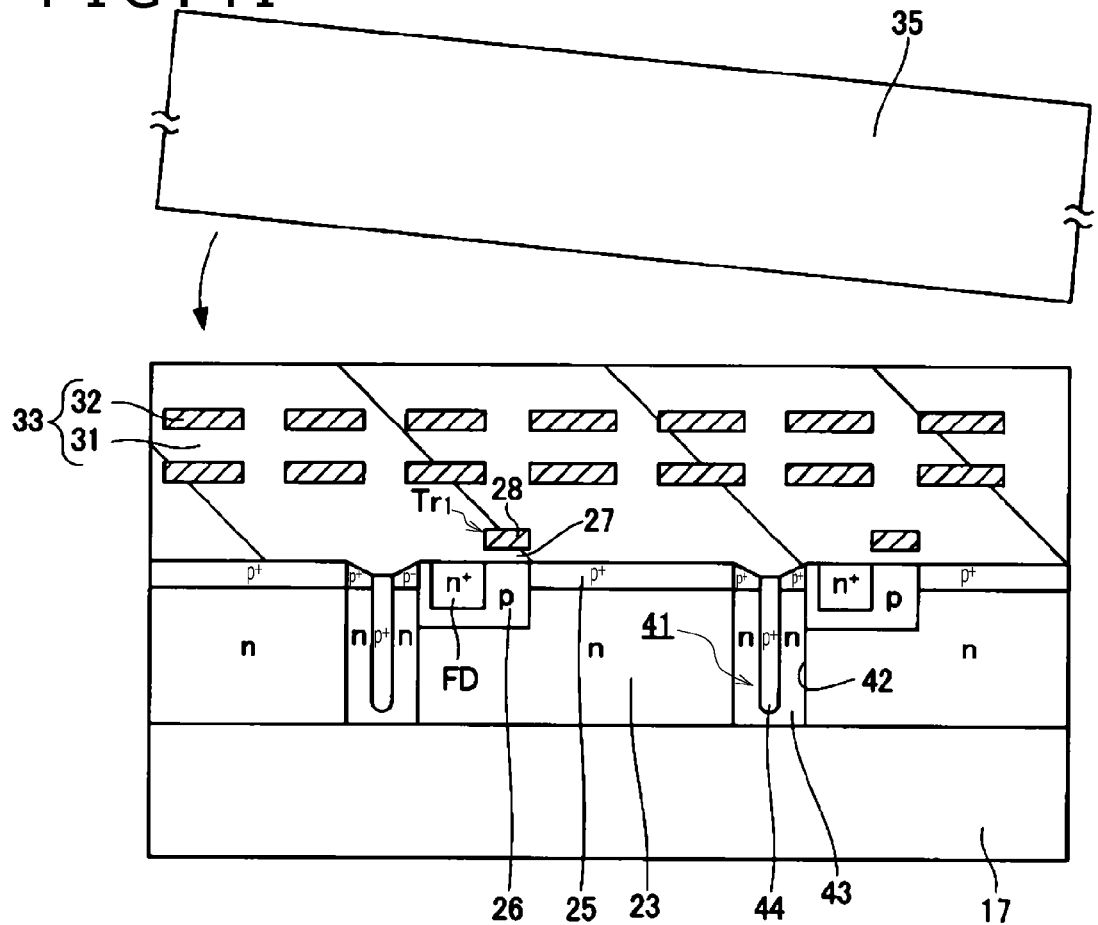
FIGS. 4I and 4J are manufacturing process diagrams showing the manufacturing method of the solid-state imaging device according to the second embodiment.

Thereafter, as shown in FIG. 4I, the supporting substrate 35 formed by a silicon substrate, for example, is laminated onto the multilayer wiring layer 33.

Figure 4J:
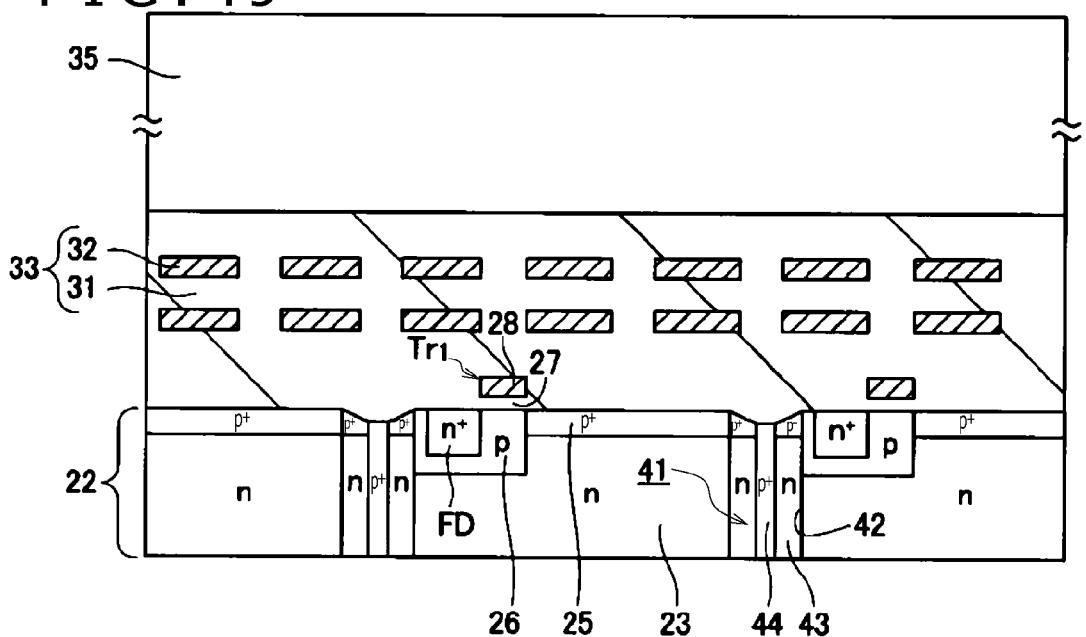

Thereafter, a back surface side is polished, and thus the bulk layer 17 on the back surface side is polished as shown in FIG. 4J. At this time, polishing is performed until the continuity between the bottom part and the side wall parts of the n-type semiconductor layer 43 is broken, and thereby the side wall parts on both sides of the n-type semiconductor layer 43 which sandwich the p-type semiconductor layer 44 are physically separated from each other.

Thereafter, though not shown, the structure is inverted, and the p-type semiconductor region 24 is formed by ion implantation at the vicinity of an interface on the back surface side of the semiconductor substrate 22.

Further, the color filter 36 and the on-chip lens 37 are sequentially formed on the semiconductor substrate 22.

The solid-state imaging device 21 shown in FIG. 2 can be thus manufactured.

The solid-state imaging device according to the present embodiment has the same constitution as the solid-state imaging device 21 according to the first embodiment. It is thus possible to reduce the width of the pixel separating section 41 and improve the separating capability of the pixel separating section 41.

The solid-state imaging device according to the present embodiment can block a leakage of a charge resulting from photoelectric conversion into adjacent pixels 38, suppress color mixture, and improve sensitivity.

Because the solid-state imaging device according to the present embodiment can suppress color mixture and improve sensitivity, even when the number of pixels is increased, the solid-state imaging device 21 having high sensitivity and a wide dynamic range and providing excellent image quality can be realized.

According to the manufacturing method of the above-described present embodiment, the n-type semiconductor layer 43 and the p-type semiconductor layer 44 are buried by epitaxial growth within the trench 42, whereby the pixel separating section 41 is formed.

Thus, because the p-type semiconductor layer 44 is buried by epitaxial growth, the p-type semiconductor layer 44 is free from ion implantation defects, and is formed as an excellent hole pinning layer.

It is therefore possible to manufacture the solid-state imaging device 21 of the back side illumination type that can suppress the occurrence of luminous dots and dark current as well as color mixture and can improve sensitivity.

<4. Third Embodiment (Solid-State Imaging Device and Manufacturing Method)>

Figure 5:
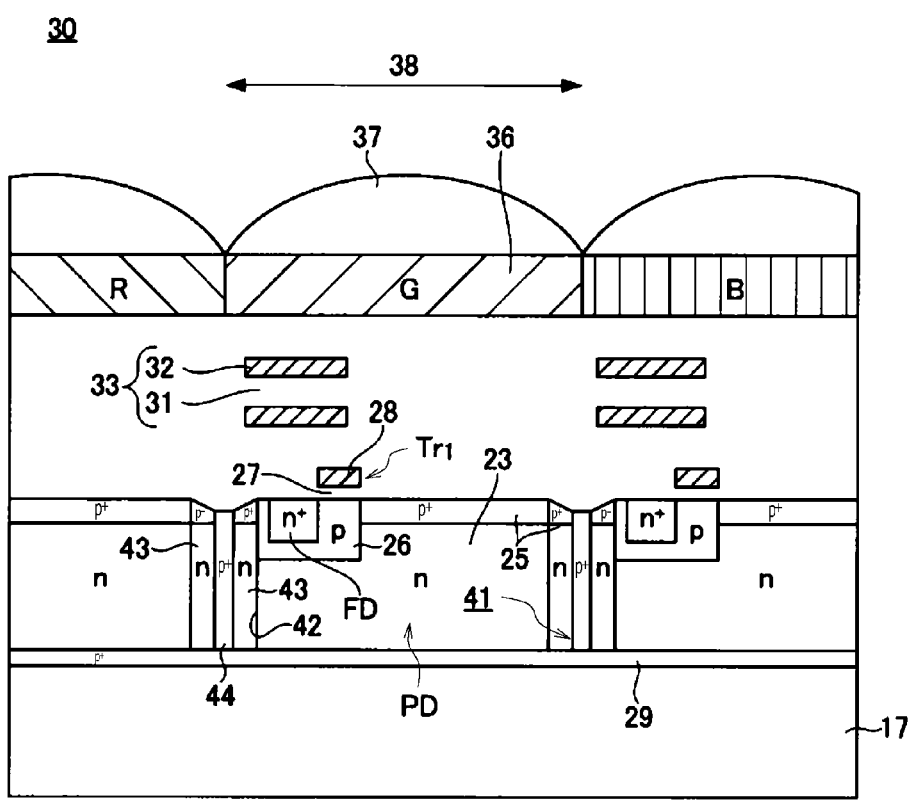
FIG. 5 is a schematic configuration diagram (sectional view) of a solid-state imaging device according to a third embodiment.

FIG. 5 is a schematic configuration diagram of a solid-state imaging device according to a third embodiment.

The present embodiment represents a case in which the present disclosure is applied to a CMOS solid-state imaging device of a front side illumination type.

In a manufacturing method according to the present embodiment, the CMOS solid-state imaging device of the front side illumination type is manufactured using a bulk substrate.

As shown in FIG. 5, a solid-state imaging device 30 according to the present embodiment has a unit pixel composed of the photodiode PD serving as the photoelectric conversion section and the plurality of pixel transistors, which unit pixel is formed above the bulk layer 17 made of a semiconductor such as silicon.

The constitution of the parts of the photodiode PD, the floating diffusion FD, and the pixel transistors such as the transfer transistor $Tr_1$ is similar to that of the solid-state imaging device 21 according to the first embodiment shown in FIG. 2. Therefore detailed description of the constitution will be omitted in the following.

The multilayer wiring layer 33 having the plurality of wiring layers 32 arranged with the interlayer insulating layer 31 interposed therebetween is formed on the parts of the photodiode PD, the floating diffusion FD, and the pixel transistors such as the transfer transistor $Tr_1$.

Because the solid-state imaging device 30 according to the present embodiment is of the front side illumination type, the arrangement of the wiring layers 32 is limited so as not to prevent the incidence of light on the photodiode PD.

Specifically, the wiring layers 32 are formed in the parts not including the photodiode PD, or in a part above the p-type semiconductor well region 26 in the section of FIG. 5.

The surface of the bulk layer 17 on the same side as the multilayer wiring layer 33 is a light receiving surface. An insulating film such as an antireflection film (not shown), a light shielding film (not shown) for blocking the incidence of incident light on adjacent pixels, and the like are formed on the surface.

Further, the color filter 36 and the on-chip lens 37 are formed on the multilayer wiring layer 33.

Light made incident on the solid-state imaging device 30 passes through the on-chip lens 37 and the color filter 36, and is applied to the photodiode PD from the surface side.

In the present embodiment, a trench 42 is formed in the silicon layer 15, and the epitaxially grown semiconductor layers 43 are buried within the trench 42, whereby the solid-state imaging device 30 is formed. The semiconductor layers 43 are formed by an n-type semiconductor layer of the same conductivity type as the n-type charge accumulating region 23 of the photodiode PD.

In the present embodiment, in particular, the epitaxially grown p-type high-concentration ($p^+$) semiconductor layer 44 is formed on the inside of the epitaxially grown n-type semiconductor layers 43, and the p-type semiconductor layer 44 forms the pixel separating section 41 configured to separate pixels from each other. Incidentally, the p-type semiconductor layer 44 is exposed at the interface of the surface of the bulk layer 17.

In a manufacturing method, as will be described later, the n-type semiconductor layers 43 and the p-type semiconductor layer 44 are sequentially grown epitaxially within the trench 42 to form the pixel separating section 41.

The n-type semiconductor layers 43 are of the same conductivity type as the n-type charge accumulating region 23 of the photodiode PD. The semiconductor layers 43 can therefore widen the photoelectric conversion section.

The n-type semiconductor layers 43 desirably have an n-type impurity concentration nearly equal to that of the n-type charge accumulating region 23 of the photodiode PD.

In addition, because the p-type semiconductor layer 44 is formed by epitaxial growth, the spread of an impurity in a lateral direction (horizontal direction) as in an impurity region formed by ion implantation does not occur in the p-type semiconductor layer 44. Thus, a uniform impurity concentration is maintained.

Further, in the solid-state imaging device 30 according to the present embodiment, a p-type high-concentration ($p^+$)

semiconductor region 29 is formed in the vicinity of the interface between the n-type silicon layer 15 and the bulk layer 17 across the entire section in FIG. 5. Incidentally, though not shown in the figure, the p-type semiconductor region 29 is formed over the entire pixel region.

By the p-type semiconductor region 29, the n-type semiconductor layers 43 on both inner walls of the trench 42 are separated from each other so as not to be connected to each other at the bottom part. The p-type semiconductor layer 44 and the p-type semiconductor region 29 can therefore separate adjacent pixels 38 from each other.

In the present embodiment, the solid-state imaging device 30 shown in FIG. 5 is manufactured using a bulk substrate.

The solid-state imaging device 30 shown in FIG. 5 can be manufactured as described in the following, for example.

First, the same processes as the respective processes shown in FIGS. 4A to 4E of the manufacturing method according to the second embodiment are performed using a bulk silicon substrate.

Thereby, as shown in FIG. 4E, the trench 42 is formed in the n-type silicon layer 15 on the bulk layer 17, and the n-type semiconductor layer 43 and the p-type semiconductor layer 44 are formed within the trench 42 by epitaxial growth. The mask material 51 remains on the silicon layer 15.

Figure 6A:
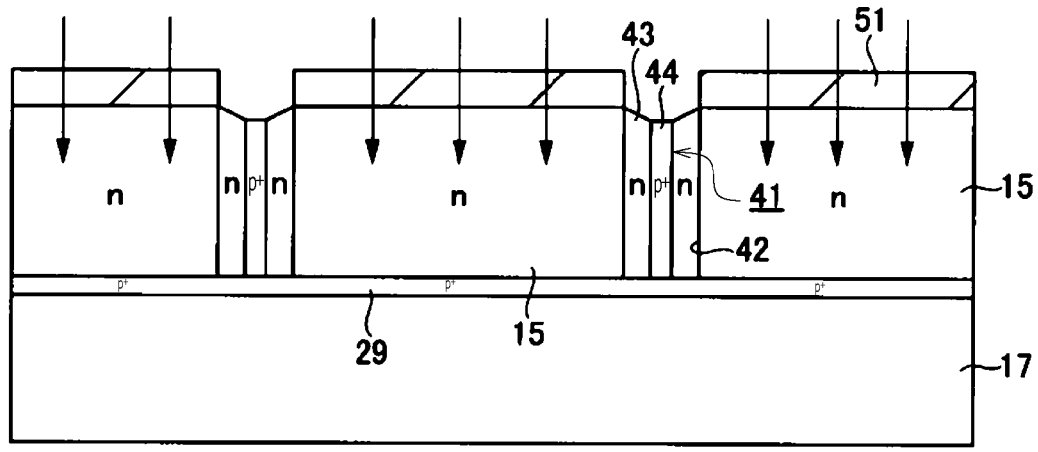
FIGS. 6A to 6C are manufacturing process diagrams showing a manufacturing method of the solid-state imaging device according to the third embodiment.

Next, as shown in FIG. 6A, the p-type semiconductor region 29 is formed by ion implantation with a p-type impurity such as boron in a deep position in the vicinity of the interface between the silicon layer 15 and the bulk layer 17. Thereby, the continuity between the bottom part and the side wall parts of the n-type semiconductor layer 43 in the trench 42 is broken, and the side wall parts on both sides of the n-type semiconductor layer 43 which sandwich the p-type semiconductor layer 44 are physically separated from each other.

Figure 6B:
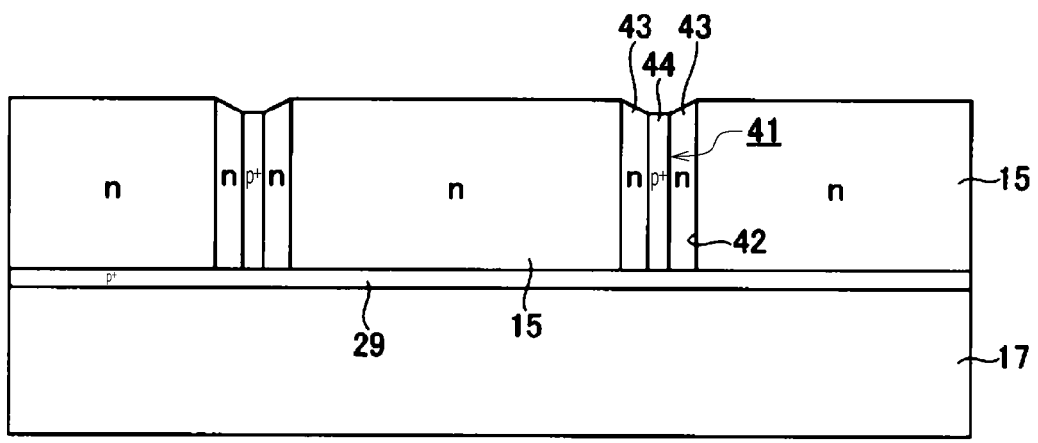

Next, as shown in FIG. 6B, the mask material 51 on the surface of the silicon layer 15 is removed by using for example a wet chemical solution (DHF or the like).

Next, annealing treatment at about 800° C., for example, is performed for the activation of the n-type semiconductor layer 43 and the p-type semiconductor layer 44 buried in the trench 42 and the recovery of a crystal at the interface of the trench 42. A heat treatment in a subsequent process can also be made to double as this annealing treatment.

Figure 6C:
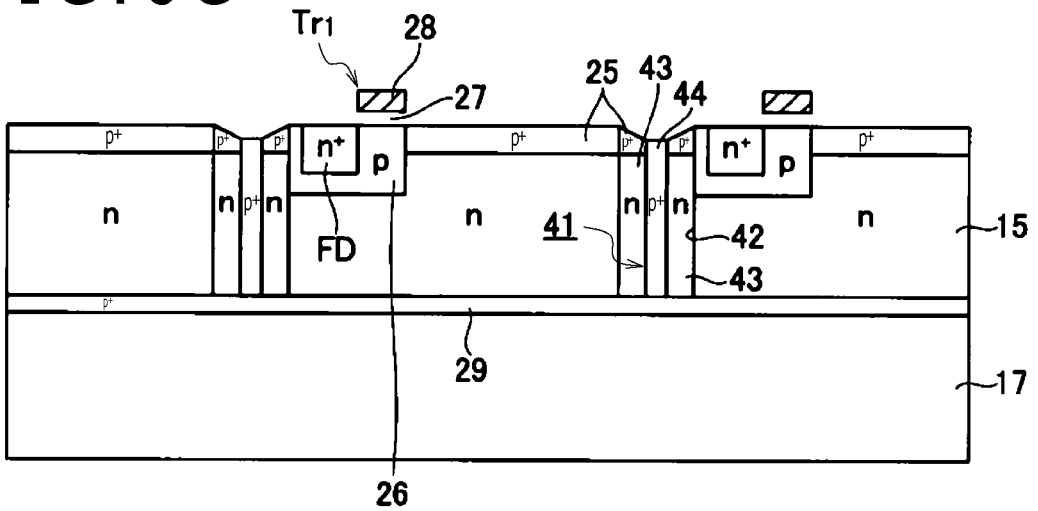

Thereafter, as shown in FIG. 6C, the respective parts forming the photodiode PD, the pixel transistors such as a transfer transistor Tr$_1$, and the floating diffusion FD are formed on the upper surface side of the silicon layer 15.

Specifically, the p-type semiconductor well region 26 is formed in the part of the upper surface side of the silicon layer 15 corresponding to each pixel separated by the pixel separating section 41.

In addition, the p-type semiconductor region 25 serving also as an accumulation layer for reducing dark current is formed in the vicinity of the upper surface of the n-type silicon layer 15 in each pixel 38. At this time, the p-type semiconductor region 25 is formed also in the vicinity of the upper surfaces of the n-type semiconductor layer 43, and therefore parts in the vicinity of the upper surfaces of the n-type semiconductor layer 43 are changed from the n-type to the p-type.

Further, the floating diffusion FD made of an n-type semiconductor region is formed in the p-type semiconductor well region 26.

Then, the transfer gate electrode 28 is formed above the p-type semiconductor well region 26 between the floating diffusion FD and the p-type semiconductor region 25, with the gate insulating film 27 interposed between the transfer gate electrode 28 and the p-type semiconductor well region 26, whereby the transfer transistor Tr$_1$ is formed. At the same time as the formation of the transfer transistor Tr$_1$, other pixel transistors composed of a pair of source/drain regions and a gate electrode are formed in other parts of the p-type semiconductor well region 26. Further, the peripheral circuit section is formed by using CMOS transistors in the periphery of the pixel region.

Further, though not shown, the multilayer wiring layer 33 is formed by arranging the plurality of wiring layers 32 with the interlayer insulating layer 31 interposed therebetween. The wiring layers 32 are formed in such a position as not to prevent the incidence of light on the photodiode PD, as shown in FIG. 5.

A space on a facet structure on the upper surface side of the n-type semiconductor layer 43 and the p-type semiconductor layer 44 is filled with the insulating material of the gate insulating film 27, the interlayer insulating layer 31, or the like.

In addition, the n-type charge accumulating region 23 is formed by the n-type silicon layer 15 in the part of the photodiode PD.

Thereafter, the color filter 36 and the on-chip lens 37 are sequentially formed on the multilayer wiring layer 33.

The solid-state imaging device 30 shown in FIG. 5 can be thus manufactured.

In the solid-state imaging device 30 according to the above-described present embodiment, the pixel separating section 41 is formed by the epitaxially grown p-type semiconductor layer 44 on the inside of the epitaxially grown n-type semiconductor layer 43 formed so as to be buried in the trench 42.

Thereby, the width of the pixel separating section 41 can be reduced as compared with a related-art structure, and the width of the pixel separating section 41 can be made smaller than the width of the trench 42. Even when the trench 42 is formed so as to be of a stable width with a necessary margin, the width of the pixel separating section 41 can be sufficiently made small.

Further, the p-type semiconductor layer 44 grown by epitaxial growth is free from implantation defects caused by ion implantation, and functions as a hole pinning layer.

On the other hand, the trench 42 recovers from etching damage in the annealing treatment before the formation of the multilayer wiring layer 33.

Thus, in the pixel separating section 41, the p-type semiconductor layer 44 is formed as a pinning layer without etching damage to the trench 42. It is therefore possible to suppress the occurrence of luminous dots or dark current at the interfaces of the pixel separating section 41 without any heat effect on the wiring layers 32.

In addition, because the p-type semiconductor layer 44 is formed by epitaxial growth, the p-type semiconductor layer 44 does not spread in the lateral direction even at a deep position unlike an ion implantation region, and a uniform impurity concentration is maintained. It is thereby possible to improve the separating capability of the pixel separating section 41, block a leakage of a charge resulting from photoelectric conversion into adjacent pixels 38, suppress color mixture, and improve sensitivity.

In the solid-state imaging device 30 according to the present embodiment, the n-type semiconductor layer 43 is of the same conductivity type as the n-type charge accumulating region 23 of the photodiode PD. Therefore the area of the photodiode can be increased by the semiconductor layer 43.

Because the area of the photodiode can be increased, sensitivity can be improved also in this respect, and an amount of saturation charge Qs can be increased. In addition, even when the number of pixels is increased, it is possible to secure photodiodes having a certain area, and thus obtain sufficient sensitivity.

On the other hand, when the area of the photodiode is equal to that of the related-art constitution, the width of the trench 42 can be made larger than the width of the pixel separating section 41. It is thereby possible to relax the aspect ratio of the trench 42, and thus increase margins for lithography and processing at the time of formation of the trench 42.

The solid-state imaging device 30 according to the present embodiment can suppress color mixture and improve sensitivity. Thus, even when the number of pixels is increased, the solid-state imaging device 30 having high sensitivity and a wide dynamic range and providing excellent image quality can be realized.

According to the manufacturing method of the above-described present embodiment, the n-type semiconductor layer 43 and the p-type semiconductor layer 44 are buried by epitaxial growth within the trench 42, whereby the pixel separating section 41 is formed.

Thus, because the p-type semiconductor layer 44 is buried by epitaxial growth, the p-type semiconductor layer 44 is free from ion implantation defects, and is formed as an excellent hole pinning layer.

It is therefore possible to manufacture the solid-state imaging device 30 of the front side illumination type that can suppress the occurrence of luminous dots and dark current as well as color mixture and can improve sensitivity.

<5. Modification Examples of Solid-State Imaging Device>

Some modification examples of the foregoing embodiments will be described below.

First, FIG. 7 is a schematic configuration diagram (sectional view) of a constitution obtained by modifying the solid-state imaging device 21 of FIG. 2 as one modification example.

A solid-state imaging device 50 shown in FIG. 7 has an insulating layer 45 buried in a space on the inside of n-type semiconductor layers 43 in place of the p-type semiconductor layer 44 formed by epitaxial growth in the solid-state imaging device 21 of FIG. 2. The constitution of the solid-state imaging device 50 is otherwise similar to that of the solid-state imaging device 21 of FIG. 2.

According to the constitution of the solid-state imaging device 50, because the insulating layer 45 is buried in the space on the inside of the n-type semiconductor layers 43, the n-type semiconductor layers 43 can increase the area of photodiodes PD, and the insulating layer 45 can separate adjacent pixels 38 from each other.

An insulating layer made of an oxide or a nitride, such as a silicon oxide layer, a hafnium oxide layer, a tantalum oxide layer, or a silicon nitride layer, for example, can be formed as the insulating layer 45.

When the solid-state imaging device 50 shown in FIG. 7 is manufactured, the n-type semiconductor layers 43 are epitaxially grown, and thereafter the insulating layer 45 is buried instead of the dopants being changed to a p-type and epitaxial growth being effected.

Then, because the insulating layer 45 is buried in the narrow space on the inside of the n-type semiconductor layers 43, an insulating material and a forming method for the insulating layer 45 are selected so as to enable the insulating layer 45 to be buried.

When there is an unnecessary insulating layer 45 on the semiconductor substrate 22, the unnecessary insulating layer 45 is removed, and the insulating layer 45 is left only within the trench 42.

Other processes can be made similar to the processes of manufacturing the solid-state imaging device 21 according to the first embodiment.

It is also possible to bury a light shielding layer on the inside of the n-type semiconductor layers 43 in place of the insulating layer 45 in FIG. 7.

A metallic layer having a light shielding property, for example, can be formed as the light shielding layer.

By burying the light shielding layer, it is possible to block a leakage of a charge into adjacent pixels, and block the incidence of obliquely incident light on the adjacent pixels by reflecting the light by the light shielding layer.

It is therefore possible to separate the adjacent pixels from each other by the light shielding layer, and suppress color mixture and improve sensitivity.

Incidentally, the constitution having the insulating layer or the light shielding layer buried on the inside of the epitaxially grown semiconductor layers formed on the inner walls of the trench is applicable not only to the first embodiment but also to solid-state imaging devices of other embodiments and other configurations.

In addition, in each of the foregoing embodiments, as the constitution in which the charge accumulating region 23 of the photodiode PD is of the n-type, the charge accumulating region 23 of the first conductivity type is of the n-type, and the semiconductor regions 24 and 25 of the second conductivity type are of the p-type. In this constitution, electrons are majority carriers, and holes are minority carriers.

On the other hand, it is also possible to adopt a constitution in which the conductivity types of impurities are opposite from each of the embodiments, the first conductivity type being the p-type and the second conductivity type being the n-type. In this constitution, holes are majority carriers, and electrons are minority carriers. As for the order of epitaxial growth in the case of this constitution, a p-type semiconductor layer is grown on inner walls of a trench, and thereafter an n-type semiconductor layer is grown on the inside.

In addition, in each of the foregoing embodiments, the color filter 36 is formed directly on the semiconductor substrate 22 or the multilayer wiring layer 33.

On the other hand, another layer, for example an insulating layer functioning as a planarizing layer or a passivation layer may be provided between the semiconductor substrate 22 or the multilayer wiring layer 33 and the color filter 36.

In addition, the constitution of the solid-state imaging device to which the structure according to each of the embodiments is applied is not limited to the constitution shown in the plan view of FIG. 1, but may be an arbitrary constitution to which the present disclosure can be applied.

<6. Fourth Embodiment (Solid-State Imaging Device and Manufacturing Method)>

Figure 8:
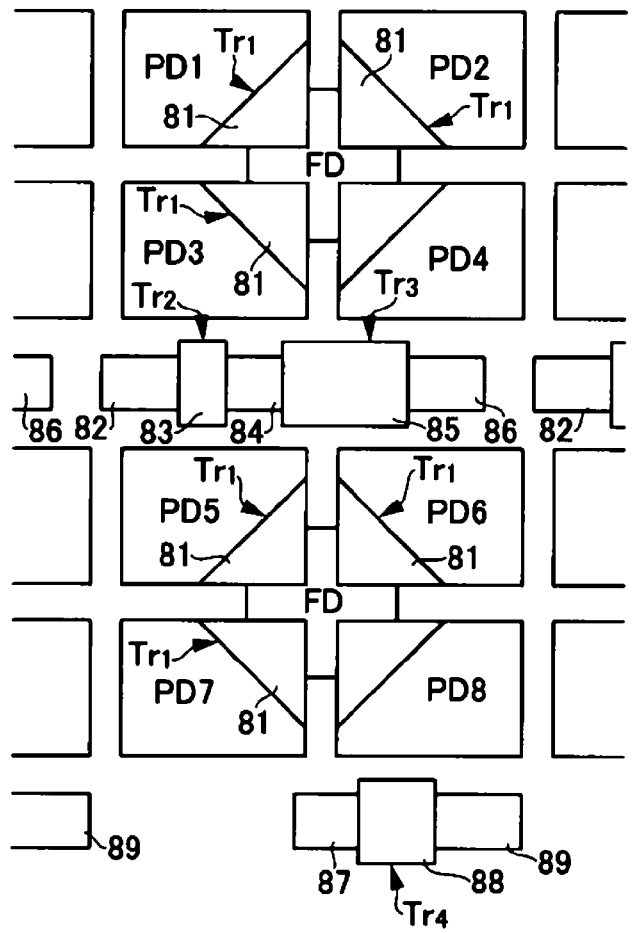
FIG. 8 is a schematic configuration diagram (plan view) of a solid-state imaging device according to a fourth embodiment.

Next, FIG. 8 is a schematic configuration diagram (plan view) of a solid-state imaging device according to a fourth embodiment as a constitution of a solid-state imaging device other than the constitution shown in the plan view of FIG. 1.

The present embodiment represents a case in which the present disclosure is applied to a so-called pixel sharing solid-state imaging device in which a plurality of photodiodes share pixel transistors other than a transfer transistor.

A solid-state imaging device 80 shown in FIG. 8 has photodiodes PD1, PD2, PD3, and PD4 as well as photodiodes PD5, PD6, PD7, and PD8, respectively in a total of four pixels with two pixels in a vertical direction and two pixels in a horizontal direction as one sharing unit (so-called four-pixel sharing). A pixel region is formed by arranging a plurality of sharing units two-dimensionally.

One sharing unit has one floating diffusion FD for the four photodiodes (PD1 to PD4 or PD5 to PD8), the floating diffusion FD being disposed at the center of the four photodiodes. The sharing unit has one transfer transistor $Tr_1$ provided for each of the photodiodes PD1 to PD8, and has one selecting transistor $Tr_2$, one amplifying transistor $Tr_1$, and one reset transistor $Tr_4$ provided commonly for the eight photodiodes PD1 to PD8.

The transfer transistor $Tr_1$ has a transfer gate electrode 81 disposed between the central floating diffusion FD and each of the photodiodes PD1 to PD4 or PD5 to PD8.

Photodiode formation regions in which four photodiodes (PD1 to PD4 or PD5 to PD8) are formed are formed consecutively in a lateral direction of FIG. 8, that is, in a row direction of pixels. A region for pixel transistors is provided between two rows of pixels. The selecting transistor $Tr_2$, the amplifying transistor $Tr_3$, and the reset transistor $Tr_4$ are formed in this region.

The selecting transistor $Tr_2$ has a pair of source/drain regions 82 and 84 and a selecting gate electrode 83.

The amplifying transistor $Tr_3$ has a pair of source/drain regions 84 and 86 and an amplifying gate electrode 85. That is, the source/drain region 84 is shared by the selecting transistor $Tr_2$ and the amplifying transistor $Tr_3$.

The reset transistor $Tr_4$ has a pair of source/drain regions 87 and 89 and a reset gate electrode 88. The reset transistor $Tr_4$ is formed in a different region for the pixel transistor which region is separate from the selecting transistor $Tr_2$ and the amplifying transistor $Tr_3$.

Pixel separating sections between adjacent photodiodes of the photodiodes PD1 to PD8 are formed by the pixel separating sections described in the foregoing first to third embodiments and the modification examples.

When the solid-state imaging device 80 according to the present embodiment is manufactured, the manufacturing methods described in the foregoing first to third embodiments and the modification examples can be applied.

According to the solid-state imaging device 80 according to the present embodiment, because the pixel separating sections between adjacent photodiodes are formed by the pixel separating sections described in the foregoing first to third embodiments and the modification examples, it is possible to suppress the occurrence of luminous dots and dark current as well as color mixture, and improve sensitivity. In addition, similar effects to those of the foregoing first to third embodiments and the modification examples are produced.

In the present embodiment, a pixel separating section made by forming epitaxially grown layers on inner wall parts of a trench can also be applied to pixel separating sections between the photodiodes PD1 to PD8 and the pixel transistors ($Tr_2$, $Tr_3$, and $Tr_4$).

However, the charge accumulating regions of the photodiodes PD1 to PD8 and the source/drain regions of the pixel transistors ($Tr_2$, $Tr_3$, and $Tr_4$) may be of a same conductivity type but different in impurity concentration and region depth in some cases. In such a case, a device is necessary for a manufacturing process because it is difficult to apply the manufacturing methods according to the foregoing embodiments as they are.

Incidentally, while the constitution of the present embodiment is applicable to a CMOS solid-state imaging device of the front side illumination type, it makes the design of wiring layers difficult because a region in which the wiring layers of a multilayer wiring layer can be arranged is reduced as compared with a constitution without pixel sharing.

It is therefore desirable to apply the constitution of the present embodiment to a CMOS solid-state imaging device of the back side illumination type.

<7. Fifth Embodiment (Electronic Device)>

The solid-state imaging devices of the above-described constitutions can be applied to electronic devices such for example as camera systems including digital cameras, video cameras, and the like, portable telephones having an imaging function, or other devices having an imaging function.

Figure 9:
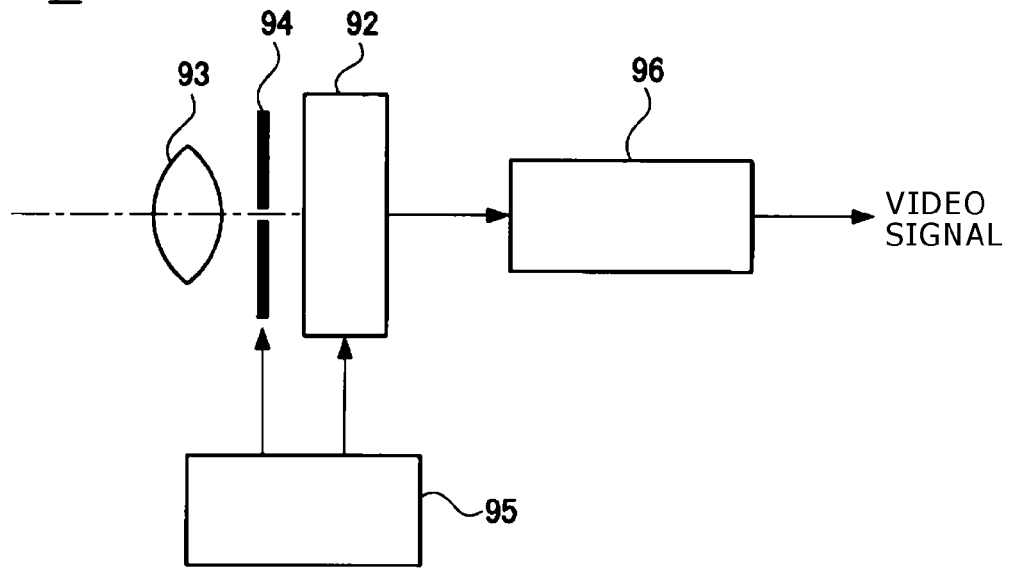
FIG. 9 is a schematic configuration diagram of an electronic device according to a fifth embodiment.
Figure 10A:
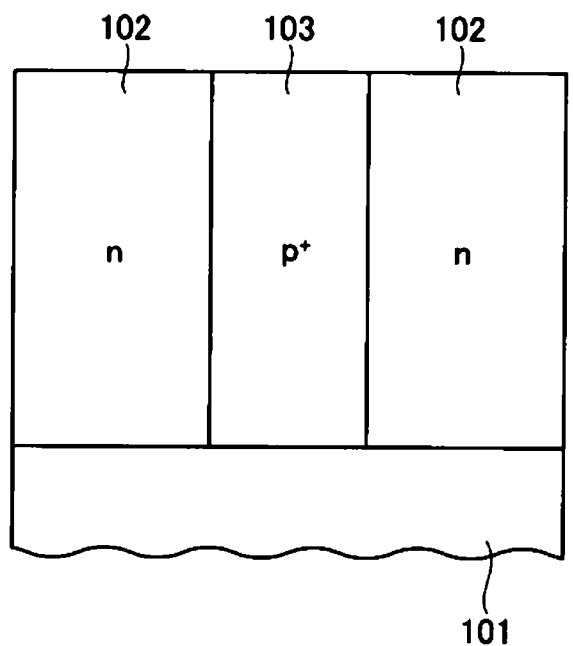
FIGS. 10A and 10B are sectional views of the vicinity of a pixel separating section in a pixel region of a solid-state imaging device in related art.
Figure 10B:
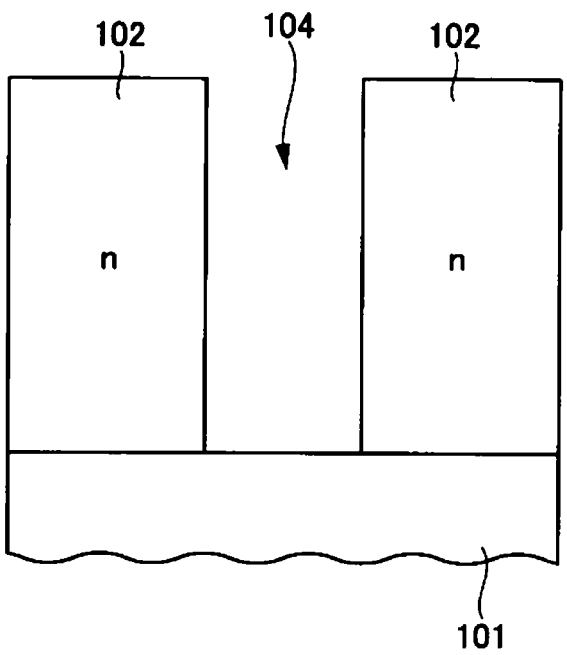

FIG. 9 is a schematic configuration diagram of an electronic device according to a fifth embodiment.

The present embodiment represents a case in which the present disclosure is applied to an imaging device (camera) as one form of an electronic device.

The imaging device (camera) according to the present embodiment can be applied to a video camera capable of taking a still image or a moving image.

As shown in FIG. 9, an imaging device (camera) 91 includes a solid-state imaging device 92, an optical system 93 configured to guide incident light to the solid-state imaging device 92, a shutter device 94, a driving circuit 95, and a signal processing circuit 96.

The solid-state imaging device according to one of the foregoing embodiments can be applied as the solid-state imaging device 92.

The optical system 93 includes an optical lens. The optical system 93 forms image light (incident light) from a subject onto an imaging surface of the solid-state imaging device 92. A signal charge is thereby accumulated within the solid-state imaging device 92 for a certain period.

The shutter device 94 controls a period of illumination to the solid-state imaging device 92 with light and a period of shielding of the solid-state imaging device 92 from light.

The driving circuit 95 supplies a driving signal for controlling the charge transfer operation of the solid-state imaging device 92 and the shutter operation of the shutter device 94. Signal transfer of the solid-state imaging device 92 is performed on the basis of the driving signal (timing signal) supplied from the driving circuit 95.

The signal processing circuit 96 performs various kinds of signal processing on the output signal of the solid-state imaging device 92. A video signal resulting from the signal processing is stored on a storage medium such as a memory, or output to a display device.

According to the electronic device of the present embodiment, the solid-state imaging device according to one of the foregoing embodiments is applied as the solid-state imaging device 92, and thereby the solid-state imaging device 92 can suppress the occurrence of luminous dots and dark current as well as color mixture, and improve sensitivity.

It is therefore possible to realize an electronic device free from color mixture, having high sensitivity and a wide dynamic range even when the number of pixels is increased, and providing excellent image quality.

In each of the foregoing embodiments, a pixel separating section according to an embodiment of the present disclosure is applied for element separation between pixels of a solid-state imaging device.

A pixel separating section according to an embodiment of the present disclosure is also applicable for element separation between a photodiode and a pixel transistor of a solid-state imaging device and for element separation for separating semiconductor regions of a same conductivity type from each other in adjacent circuit elements (active elements such as transistors or passive elements) in an ordinary semiconductor device.

Incidentally, the present disclosure can also adopt following constitutions.

(1) A solid-state imaging device including: a photoelectric conversion section configured to have a charge accumulating region of a first conductivity type formed in a semiconductor layer; a pixel having the photoelectric conversion section and a pixel transistor; a pixel region in which a plurality of the pixels are arranged; an epitaxially grown semiconductor layer of the first conductivity type formed on an inner wall part of a trench disposed in the semiconductor layer at least between adjacent ones of the pixels within the pixel region; and a pixel separating section configured to separate the charge accumulating regions of the adjacent ones of the pixels from each other, the pixel separating section being formed on the inside of the semiconductor layer of the first conductivity type.

(2) The solid-state imaging device according to the above (1), in which the pixel separating section is formed by an epitaxially grown semiconductor layer of a second conductivity type.

(3) The solid-state imaging device according to the above (1), in which the pixel separating section is formed by an insulating layer or a light shielding layer.

(4) The solid-state imaging device according to any one of the above (1) to (3), in which the solid-state imaging device is a solid-state imaging device of a back side illumination type in which a multilayer wiring layer having a plurality of wiring layers disposed with an interlayer insulating layer interposed between the plurality of wiring layers is disposed on a front surface side of the semiconductor layer, and a back surface side of the semiconductor layer is a light receiving surface.

(5) A manufacturing method of a solid-state imaging device having a pixel region in which a plurality of pixels including a photoelectric conversion section configured to have a charge accumulating region of a first conductivity type and a pixel transistor are arranged, the method including: forming a region of the first conductivity type by implanting an impurity of the first conductivity type into a semiconductor layer; forming a trench in the region of the first conductivity type at least between adjacent ones of the pixels; forming a semiconductor layer of the first conductivity type by epitaxial growth on an inner wall part of the trench; forming a pixel separating section separating the charge accumulating regions of the adjacent ones of the pixels from each other on the inside of the semiconductor layer of the first conductivity type; and forming the pixels including the photoelectric conversion section and the pixel transistor, with the region of the first conductivity type in a part adjacent to the trench as the charge accumulating region.

(6) The manufacturing method of the solid-state imaging device according to the above (5), in which the pixel separating section is formed by an epitaxially grown semiconductor layer of a second conductivity type.

(7) The manufacturing method of the solid-state imaging device according to the above (5), in which the pixel separating section is formed by an insulating layer or a light shielding layer.

(8) The manufacturing method of the solid-state imaging device according to any one of the above (5) to (7), further including: forming a multilayer wiring layer having a plurality of wiring layers disposed with an interlayer insulating layer interposed between the plurality of wiring layers on a front surface of the semiconductor layer; laminating a supporting substrate onto the multilayer wiring layer; exposing the pixel separating section by performing polishing from a back surface side of the semiconductor layer; and then sequentially forming a color filter and an on-chip lens on a back surface of the semiconductor layer.

(9) An electronic device including: the solid-state imaging device according to any one of the above (1) to (4); an optical system configured to guide incident light to the photoelectric conversion section of the solid-state imaging device; and a signal processing circuit configured to process an output signal of the solid-state imaging device.

The present disclosure is not limited to the foregoing embodiments, but can adopt various other constitutions without departing from the scope of the present disclosure.

The present disclosure contains subject matter related to that disclosed in Japanese Priority Patent Application JP 2011-148884 filed in the Japan Patent Office on Jul. 5, 2011, the entire content of which is hereby incorporated by reference.

What is claimed is:

1. A solid-state imaging device comprising:
a photoelectric conversion section including a charge accumulating region of a first conductivity type formed in a semiconductor layer;
a pixel including the photoelectric conversion section and a pixel transistor;
a pixel region in which a plurality of pixels are arranged;
an epitaxially grown semiconductor layer of the first conductivity type formed on an inner wall portion of a trench disposed in the semiconductor layer at least between adjacent pixels of the plurality of pixels within the pixel region; and
a pixel separating section of a second conductivity type configured to separate charge accumulating regions of adjacent pixels of the plurality of pixels from each other, the pixel separating section being formed on the inside of the semiconductor layer of the first conductivity type.

2. The solid-state imaging device according to claim 1, wherein the pixel separating section is formed by an epitaxially grown semiconductor layer of the second conductivity type.

3. The solid-state imaging device according to claim 1, wherein the solid-state imaging device is a solid-state imaging device of a back side illumination type in which a multilayer wiring layer having a plurality of wiring layers disposed with an interlayer insulating layer interposed between the plurality of wiring layers is disposed on a front surface side of the semiconductor layer, and a back surface side of the semiconductor layer is a light receiving surface.

4. The solid-state imaging device according to claim 1, wherein the trench penetrates a top and bottom surface of the semiconductor layer.

5. The solid-state imaging device according to claim 4, wherein portions of the epitaxially grown semiconductor layer are the second conductivity type.

6. A manufacturing method of a solid-state imaging device having a pixel region in which a plurality of pixels having a photoelectric conversion section including a charge accumulating region of a first conductivity type and a pixel transistor are arranged, the method comprising:
forming a region of the first conductivity type by implanting an impurity of the first conductivity type into a semiconductor layer;
forming a trench in the region of the first conductivity type at least between adjacent pixels of the plurality of pixels;
forming a semiconductor layer of the first conductivity type by epitaxial growth on an inner wall part of the trench;

forming a pixel separating section of a second conductivity type by separating charge accumulating regions of the adjacent pixels of the plurality of pixels from each other on the inside of the semiconductor layer of the first conductivity type; and forming the pixels including the photoelectric conversion section and the pixel transistor, with the region of the first conductivity type in a portion adjacent to the trench as the charge accumulating region.

7. The manufacturing method of the solid-state imaging device according to claim 6, wherein the pixel separating section is formed by an epitaxially grown semiconductor layer of the second conductivity type.

8. The manufacturing method of the solid-state imaging device according to claim 6, further comprising:

forming a multilayer wiring layer having a plurality of wiring layers disposed with an interlayer insulating layer interposed between the plurality of wiring layers on a front surface of the semiconductor layer;

laminating a supporting substrate onto the multilayer wiring layer;

exposing the pixel separating section by performing polishing from a back surface side of the semiconductor layer; and then sequentially forming a color filter and an on-chip lens on a back surface of the semiconductor layer.

9. An electronic device comprising:

a solid-state imaging device including:

a photoelectric conversion section including a charge accumulating region of a first conductivity type formed in a semiconductor layer, a pixel including the photoelectric conversion section and a pixel transistor, a pixel region in which a plurality of the pixels are arranged, an epitaxially grown semiconductor layer of the first conductivity type formed on an inner wall portion of a trench disposed in the semiconductor layer at least between adjacent pixels of the plurality of pixels within the pixel region, and a pixel separating section of a second conductivity type separating the charge accumulating regions of the adjacent pixels of the plurality of pixels from each other, the pixel separating section being formed on the inside of the semiconductor layer of the first conductivity type;

an optical system for guiding incident light to the photoelectric conversion section of the solid-state imaging device; and a signal processing circuit for processing an output signal of the solid-state imaging device.

* * * * *